(12) United States Patent
Shin et al.

(10) Patent No.: US 12,035,569 B2
(45) Date of Patent: Jul. 9, 2024

(54) HYDROPHOBIC AND HYDROPHILIC DUAL BANK STRUCTURES IN ORGANIC LIGHT EMITTING DISPLAY DEVICE

(71) Applicant: LG Display Co., Ltd., Seoul (KR)

(72) Inventors: Kwanghoon Shin, Paju-si (KR); Joungwon Woo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 248 days.

(21) Appl. No.: 16/725,200

(22) Filed: Dec. 23, 2019

(65) Prior Publication Data
US 2020/0212146 A1 Jul. 2, 2020

(30) Foreign Application Priority Data
Dec. 26, 2018 (KR) .................. 10-2018-0169813

(51) Int. Cl.
*H10K 59/122* (2023.01)
*H10K 59/121* (2023.01)
(Continued)

(52) U.S. Cl.
CPC ......... *H10K 59/122* (2023.02); *H10K 59/121* (2023.02); *H10K 59/131* (2023.02);
(Continued)

(58) Field of Classification Search
CPC ............. H01L 27/3246; H01L 27/3276; H01L 27/322; H01L 27/324–3279;
(Continued)

(56) References Cited

U.S. PATENT DOCUMENTS

2014/0145157 A1* 5/2014 Kim .................. H01L 27/3246
257/40
2014/0197396 A1 7/2014 Madigan
(Continued)

FOREIGN PATENT DOCUMENTS

CN 106328679 A 1/2017
JP 2003-208979 A 7/2003
(Continued)

OTHER PUBLICATIONS

Chinese Office Action dated Mar. 23, 2023 issued in Patent Application No. 201911316908.2 w/English Translation (14 pages).
(Continued)

*Primary Examiner* — Brigitte A Paterson
(74) *Attorney, Agent, or Firm* — POLSINELLI PC

(57) ABSTRACT

An organic light-emitting display device comprises a substrate; a plurality of sub-pixels arranged in a first horizontal line and a second horizontal line on the substrate; at least one thin film transistor and a first electrode of an organic light-emitting diode connected to the thin film transistor, the at least one thin film transistor and the organic light-emitting diode being disposed in each of the plurality of sub-pixels; a first bank layer is disposed on the first electrode and exposing the first electrode; and a second bank layer disposed on the first bank layer and exposing the first bank layer and the first electrode, wherein the second bank layer is consecutively arranged in the first horizontal line and the second horizontal line and including a first bending portion at a boundary between the first horizontal line and the second horizontal line.

18 Claims, 13 Drawing Sheets

(51) Int. Cl.
*H10K 59/131* (2023.01)
*H10K 59/35* (2023.01)
*H10K 59/38* (2023.01)
*H10K 71/13* (2023.01)
*H10K 102/00* (2023.01)

(52) U.S. Cl.
CPC ......... *H10K 59/352* (2023.02); *H10K 59/353* (2023.02); *H10K 59/38* (2023.02); *H10K 71/13* (2023.02); *H10K 2102/351* (2023.02)

(58) Field of Classification Search
CPC .. H01L 27/3218; H10K 59/38; H10K 59/131; H10K 59/122
See application file for complete search history.

(56) References Cited

U.S. PATENT DOCUMENTS

| | | | |
|---|---|---|---|
| 2016/0079323 A1* | 3/2016 | Choi | H01L 27/3246 257/40 |
| 2017/0005149 A1* | 1/2017 | Park | H01L 51/56 |
| 2018/0180951 A1* | 6/2018 | Toyotaka | H01L 27/3258 |
| 2019/0131589 A1* | 5/2019 | Matsueda | H01L 27/3276 |

FOREIGN PATENT DOCUMENTS

| | | |
|---|---|---|
| JP | 2007-293329 A | 11/2007 |
| KR | 2003-0086296 A | 11/2003 |
| KR | 10-2011-0030954 A | 3/2011 |
| KR | 10-2016-0033804 A | 3/2016 |
| KR | 2018-0025431 A | 3/2018 |
| KR | 2018-0061573 A | 6/2018 |
| KR | 2018-0076820 A | 7/2018 |

OTHER PUBLICATIONS

Korean Office Action dated Nov. 21, 2023 issued in Patent Application No. 10-2018-0169813 (16 pages).

* cited by examiner

HYDROPHOBIC AND HYDROPHILIC DUAL BANK STRUCTURES IN ORGANIC LIGHT EMITTING DISPLAY DEVICE

CROSS REFERENCE TO RELATED APPLICATION

This application claims the priority benefit of Korean Patent Application No. 10-2018-0169813 filed on Dec. 26, 2018, which is hereby incorporated by reference in its entirety.

BACKGROUND

Field of the Disclosure

The present disclosure relates to a display device, and more particularly, to an organic light-emitting display device having a double bank structure. Although the present disclosure is suitable for a wide scope of applications, it is particularly suitable for providing the organic light-emitting display device with uniform thickness of the organic light emitting layer.

Description of the Background

Various display devices having reduced weights and volumes which replace a conventional display device using a cathode ray tube have been developed. Such display devices include a liquid crystal display (LCD), a plasma display panel (PDP), a field emission display (FED), an organic light-emitting display device, and the like.

An organic light-emitting display device includes elements that spontaneously emit light and has advantages of a high response speed, high emission efficiency, a high luminance and a wide viewing angle. In addition, the elements can be formed on a flexible substrate such as plastic and thus a flexible display device can be realized.

As the organic light-emitting display device having a large area and a high resolution is required, a plurality of sub-pixels is included in a single panel. A mask is generally used to pattern organic light emitting layers of red (R), green (G) and blue (B) sub-pixels. To realize a display device having a large area, a fine metal mask (FMM) having a large area corresponding to a substrate with a large area is required. However, a mask can be bent as the area thereof increases, causing occurrence of various failures such as non-deposition of an organic light emitting material which forms an organic light emitting layer at a desired position.

To solve the aforementioned problem of a deposition method using a mask, a solution process which is simple and is advantageous for a large area is attracting interest. The solution process can pattern a large-area organic light emitting layer through inkjet printing or nozzle printing without a mask and has a very high material use rate of 50% to 80% compared to vacuum evaporation having a material use rate of below 10%. In addition, the solution process provides a glass transition temperature higher than that of a vacuum evaporated thin film and thus achieves a high thermal stability and a desirable morphology property.

However, when an organic light emitting layer is formed through the solution process, non-uniform thickness of the organic light emitting layer due to thickness deviations in sub-pixels may considerably deteriorate display quality.

SUMMARY

Accordingly, the present disclosure is directed to an organic light-emitting display device that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

To achieve these and other advantages and in accordance with the aspects of the present disclosure, an organic light-emitting display device comprises a substrate; a plurality of sub-pixels arranged in a first horizontal line and a second horizontal line on the substrate; at least one thin film transistor and a first electrode of an organic light-emitting diode connected to the thin film transistor, the at least one thin film transistor and the organic light-emitting diode being disposed in each of the plurality of sub-pixels; a first bank layer is disposed on the first electrode and exposing the first electrode; and a second bank layer disposed on the first bank layer and exposing the first bank layer and the first electrode, wherein the second bank layer is consecutively arranged in the first horizontal line and the second horizontal line and including a first bending portion at a boundary between the first horizontal line and the second horizontal line.

In another aspect of the present disclosure, An organic light-emitting display device configured on a substrate comprises a first sub-pixel arranged in a first horizontal line; a second sub-pixel arranged in a second horizontal line parallel to the first horizontal line; a third sub-pixel arranged in a third horizontal line parallel to the second horizontal line; a thin film transistor on the substrate; an organic light-emitting diode including a first electrode, a second electrode and an organic light emitting layer, the first electrode connected to the thin film transistor, the organic light emitting layer disposed on the first electrode and the second electrode on the organic light emitting layer; at least one of a data line, a sensing line, a power line and a cathode power line intersecting the first horizontal line; a first bank layer is disposed on the first electrode and exposing the first electrode; and a second bank layer disposed on the first bank layer and exposing the first bank layer and the first electrode, wherein the second bank layer is consecutively arranged in the first, second and third horizontal lines and including a first bending portion at a boundary between the first horizontal line and the second horizontal line and a second bending portion on a boundary of the second horizontal line and the third horizontal line.

The first bank layer may include a first opening exposing the first electrode and the second bank layer may include a second opening exposing the first bank layer and the first electrode.

The first opening and the second opening may be overlapped on the at least one line.

The first electrode may be overlapped on the at least one line.

The first horizontal line may include at least one first sub-pixel and the second horizontal lien may include at least one second sub-pixels, wherein the first sub-pixel may have a center line extending in parallel with the at least one line, and the center line of the first electrode of the first sub-pixel may be disposed on one side on the basis of the center line of the first sub-pixel.

The center line of the first electrode of the second sub-pixel may be disposed on the other side on the basis of the center line of the second sub-pixel.

The third horizontal line may include at least one third sub-pixel, and the center line of the first electrode of the third sub-pixel may be disposed on the same side as the one side on the basis of the center line of the third sub-pixel.

The first horizontal line, the second horizontal line and the third horizontal line may include a plurality of sub-pixels in a direction in which the first to third horizontal lines are arranged.

The first horizontal line, the second horizontal line and the third horizontal line may include a plurality of sub-pixels in a direction in which the first to third horizontal lines are arranged.

The organic light-emitting diode may include an organic light emitting layer disposed on the first electrode and a second electrode disposed on the organic light emitting layer.

The first bank layer may have hydrophilicity and the second bank layer may have hydrophobicity.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
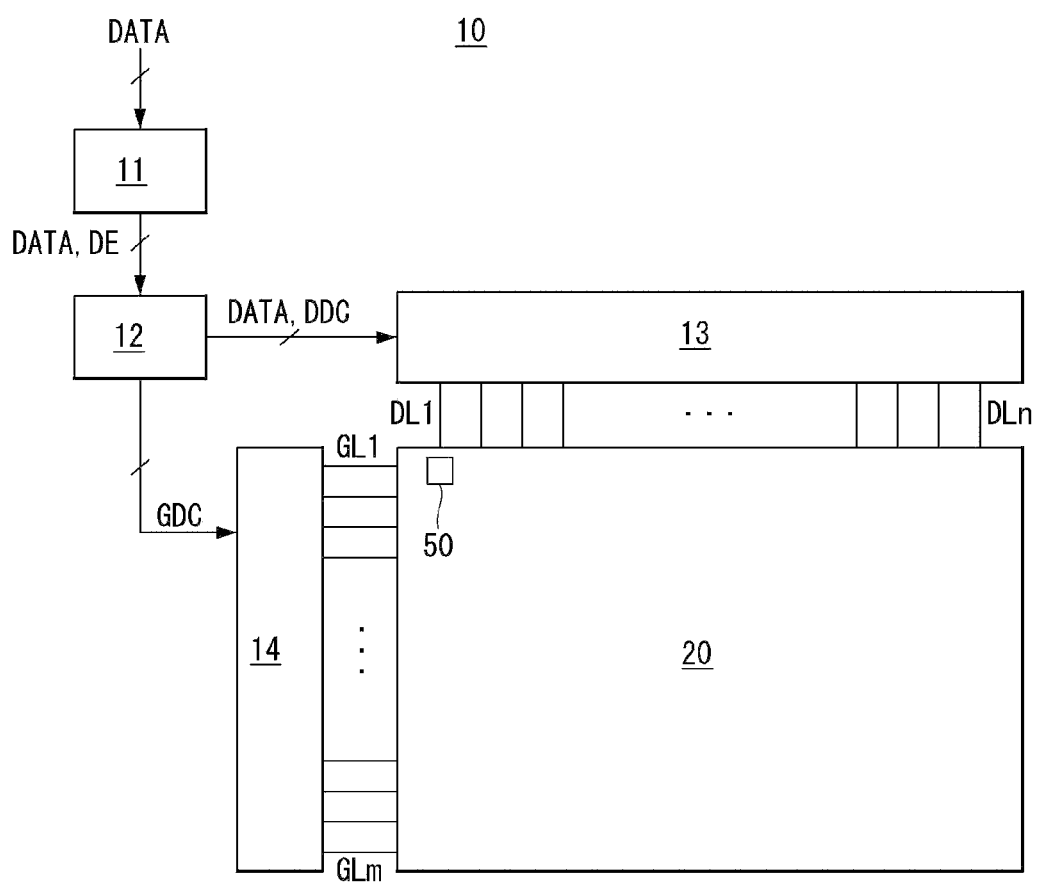
FIG. 1 is a schematic block diagram of an organic light-emitting display device.

The advantages, features and methods for accomplishing the same of the present disclosure will become more apparent through the following detailed description with respect to the accompanying drawings. However, the present disclosure is not limited by aspects described blow and is implemented in various different forms, and the aspects are provided so that this disclosure will be thorough and complete, and will fully convey the scope of the disclosure to those skilled in the art. The present disclosure is defined by the scope of the claims.

Shapes, sizes, ratios, angles, numbers, etc. shown in the figures to describe aspects of the present disclosure are exemplary and thus are not limited to particulars shown in the figures. Like numbers refer to like elements throughout the specification. It will be further understood that when the terms "include", "have" and "comprise" are used in this specification, other parts may be added unless "~ only" is used. An element described in the singular form is intended to include a plurality of elements unless context clearly indicates otherwise.

In interpretation of a component, the component is interpreted as including an error range unless otherwise explicitly described.

It will be understood that, when an element is referred to as being "on" or "under" another element, it can be "directly" on or under another element or can be "indirectly" formed such that an intervening element is also present.

In the following description of the aspects, "first" and "second" are used to describe various components, but such components are not limited by these terms. The terms are used to discriminate one component from another component. Accordingly, a first component mentioned in the following description may be a second component within the technical spirit of the present disclosure.

Features of aspects of the present disclosure can be coupled or combined partially or overall and technically interoperated in various manners, and the aspects may be implemented independently or associatively.

Hereinafter, aspects of the present disclosure will be described in detail with reference to the attached drawings. The same reference numbers refer to the same components throughout this specification. In the following description, if a detailed description of known techniques associated with the present disclosure would unnecessarily obscure the gist of the present disclosure; detailed description thereof will be omitted.

Although examples of a display device according to the present disclosure may include an organic light-emitting display device, a liquid crystal display, an electrophoretic display device, and the like, the organic light-emitting display device is exemplified in the present disclosure. The organic light-emitting display device includes an organic light emitting layer formed of an organic material between a first electrode that is an anode and a second electrode that is a cathode. Accordingly, the organic light-emitting display device is a spontaneous light emitting display device which emits light according to energy generated when excitons, which are hole-electron pairs generated according to combination of holes supplied from the first electrode and electrons supplied from the second electrode in the organic light emitting layer, are dropped to the ground state.

Figure 2:
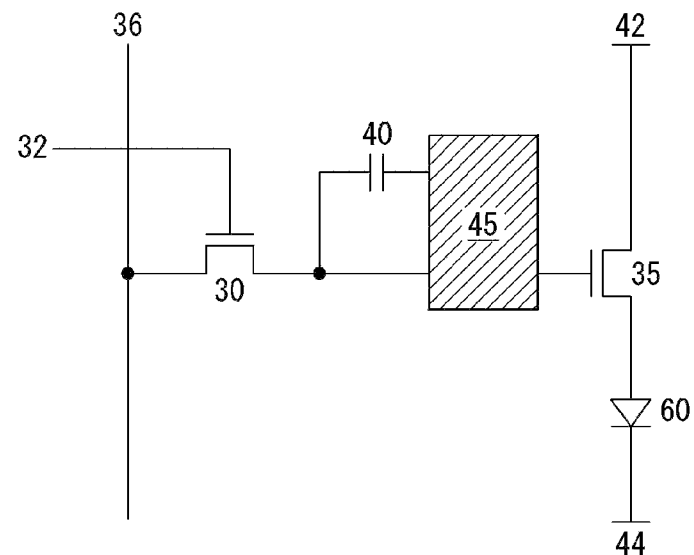
FIG. 2 is a schematic circuit diagram of a sub-pixel.

FIG. 1 is a schematic block diagram of an organic light-emitting display device, and FIG. 2 is a schematic circuit diagram of a sub-pixel.

As shown in FIG. 1, the organic light-emitting display device 10 includes an image processor 11, a timing controller 12, a data driver 13, a scan driver 14 and a display panel 20.

The image processor 11 outputs a data enable signal DE along with a data signal DATA supplied from an external device. Although the image processor 11 may also output one or more of a vertical synchronization signal, a horizontal synchronization signal and a clock signal in addition to the data enable signal DE, illustration of these signals is omitted for convenience of description.

The timing controller 12 is provided with the data signal DATA along with the data enable signal DE or driving signals including the vertical synchronization signal, the horizontal synchronization signal, the clock signal and the like from the image processor 11. The timing controller 12 outputs a gate timing control signal GDC for controlling operation timing of the scan driver 14 and a data timing control signal DDC for controlling operation timing of the data driver 13 on the basis of the driving signals.

The data driver 13 samples and latches the data signal DATA supplied from the timing controller 12 in response to the data timing control signal DDC supplied from the timing controller 12 to convert the data signal DATA into a gamma reference voltage and outputs the gamma reference voltage. The data driver 13 outputs the data signal DATA through data lines DL1 to DLn. The data driver 13 may be configured in the form of an integrated circuit (IC).

The scan driver 14 outputs a scan signal in response to the gate timing control signal GDC supplied from the timing controller 12. The scan driver 14 outputs the scan signal through gate lines GL1 to GLm. The scan driver 14 is configured in the form of an IC or configured as a gate in panel (GOP) in the display panel 20.

The display panel 20 displays an image in response to the data signal DATA and the scan signal supplied from the data driver 13 and the scan driver 14. The display panel 20 includes sub-pixels 50 that operate to display images.

The sub-pixels 50 include red, green and blue sub-pixels or include white, red, green and blue sub-pixels. The sub-pixels 50 may have one or more different emission areas according to emission characteristics.

As shown in FIG. 2, one sub-pixel includes a switching transistor 30, a driving transistor 35, a capacitor 40, a compensation circuit 45 and an organic light-emitting diode 60.

The switching transistor 30 performs a switching operation such that a data signal supplied through a first data line 36 is stored as a data voltage in the capacitor 40 in response to a scan signal supplied through a first gate line 32. The driving transistor 35 operates to allow a driving current to flow between a power line (high voltage) 42 and a cathode power line (low voltage) 44 according to the data voltage stored in the capacitor 40. The organic light-emitting diode 60 operates to emit light according to the driving current generated by the driving transistor 35.

The compensation circuit 45 is a circuit added to the sub-pixel in order to compensate for a threshold voltage of the driving transistor 35. The compensation circuit 45 is composed of one or more transistors. The compensation circuit 45 is configured in various manners according to external compensation methods, and an example thereof will be described below.

Figure 3:
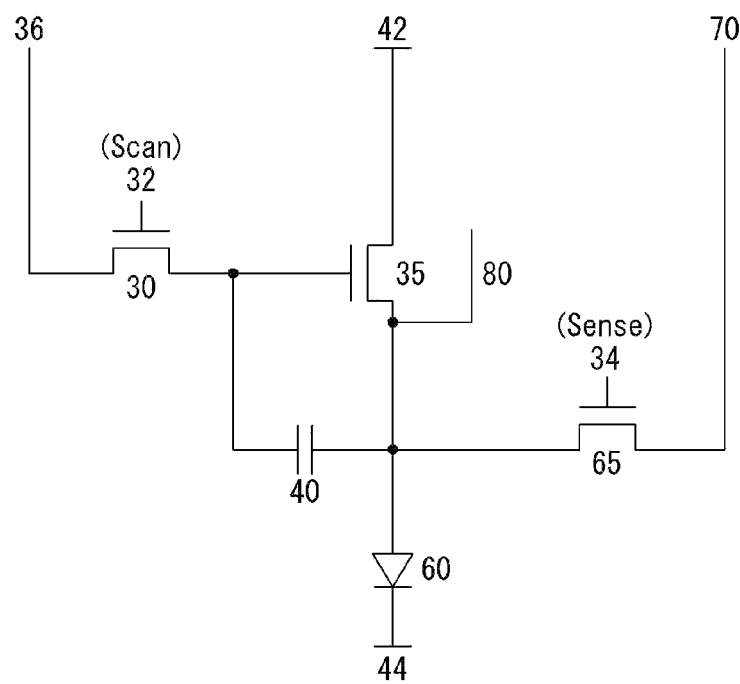
FIG. 3 is a detailed circuit diagram of the sub-pixel.

As shown in FIG. 3, the compensation circuit 45 includes a sensing transistor 65 and a sensing line (or a reference line) 70. The sensing transistor 65 is connected between the source electrode of the driving transistor 35 and the anode of the organic light-emitting diode 60 (connected to a sensing node). The sensing transistor 65 operates to supply an initialization voltage (or a sensing voltage) delivered through the sensing line 70 to the sensing node of the driving transistor 35 or to sense a voltage or current of the sensing node of the driving transistor 35 or the sensing line 70.

The switching transistor 30 has a first electrode connected to the first data line 36 and a second electrode connected to the gate electrode of the driving transistor 35. The driving transistor 35 has a first electrode connected to the power line 42 and a second electrode connected to the anode of the organic light-emitting diode 60. The capacitor 40 has a first electrode connected to the gate electrode of the driving transistor 35 and a second electrode connected to the anode of the organic light-emitting diode 60. The organic light-emitting diode 60 has the anode connected to the second electrode of the driving transistor 35 and the cathode connected to the second power line 44. The sensing transistor 65 has a first electrode connected to the sensing line 70 and a second electrode connected to the anode of the organic light-emitting diode 60 and the second electrode of the driving transistor 35.

The operating time of the sensing transistor 65 may be similar or identical to that of the switching transistor 30 according to an external compensation algorithm (or the configuration of the compensation circuit). For example, the gate electrode of the switching transistor 30 may be connected to the first gate line 32 and the gate electrode of the sensing transistor 65 may be connected to a second gate line 34. In this case, a scan signal Scan is transmitted through the first gate line 32 and a sensing signal Sense is transmitted through the second gate line 34. As another example, the first gate line 32 connected to the gate electrode of the switching transistor 30 and the second gate line 34 connected to the gate electrode of the sensing transistor 65 may be connected such that they are commonly shared.

The sensing line 70 can be connected to the data driver. In this case, the data driver can sense sensing nodes of sub-pixels and generate sensing results for a non-display period or N frames (N is an integer equal to or greater than 1) of an image in real time. Meanwhile, the switching transistor 30 and the sensing transistor 65 may be turned on at the same time. In this case, a sensing operation through the sensing line 70 and a data output operation for outputting a data signal are separated (or distinguished) from each other according to a time division operation of the data driver.

In addition, a compensation object according to sensing results may be a digital data signal, an analog data signal, gamma or the like. Further, a compensation circuit for generating a compensation signal (or a compensation voltage) on the basis of sensing results may be configured in the data driver or the timing controller or configured as an additional circuit.

A light shielding layer 80 may be disposed only under a channel region of the driving transistor 35 or disposed under channel regions of the switching transistor 30 and the sensing transistor 65 as well as the channel region of the driving transistor 35. The light shielding layer 80 may be simply used for the purpose of blocking external light or may be used an electrode that is connected to other electrodes or lines and constitutes a capacitor and the like. Accordingly, a multi-level metal layer (i.e., multiple levels of dissimilar metals) is selected as the light shielding layer 80 such that it has light shielding characteristics.

Although a sub-pixel in a 3T(Transistor)1C(Capacitor) structure including the switching transistor 30, the driving transistor 35, the capacitor 40, the organic light-emitting diode 60 and the sensing transistor 65 has been described as an example in FIG. 3, a sub-pixel may be configured in 3T2C, 4T2C, 5T1C, 6T2C and the like when the compensation circuit 45 is added.

Figure 4:
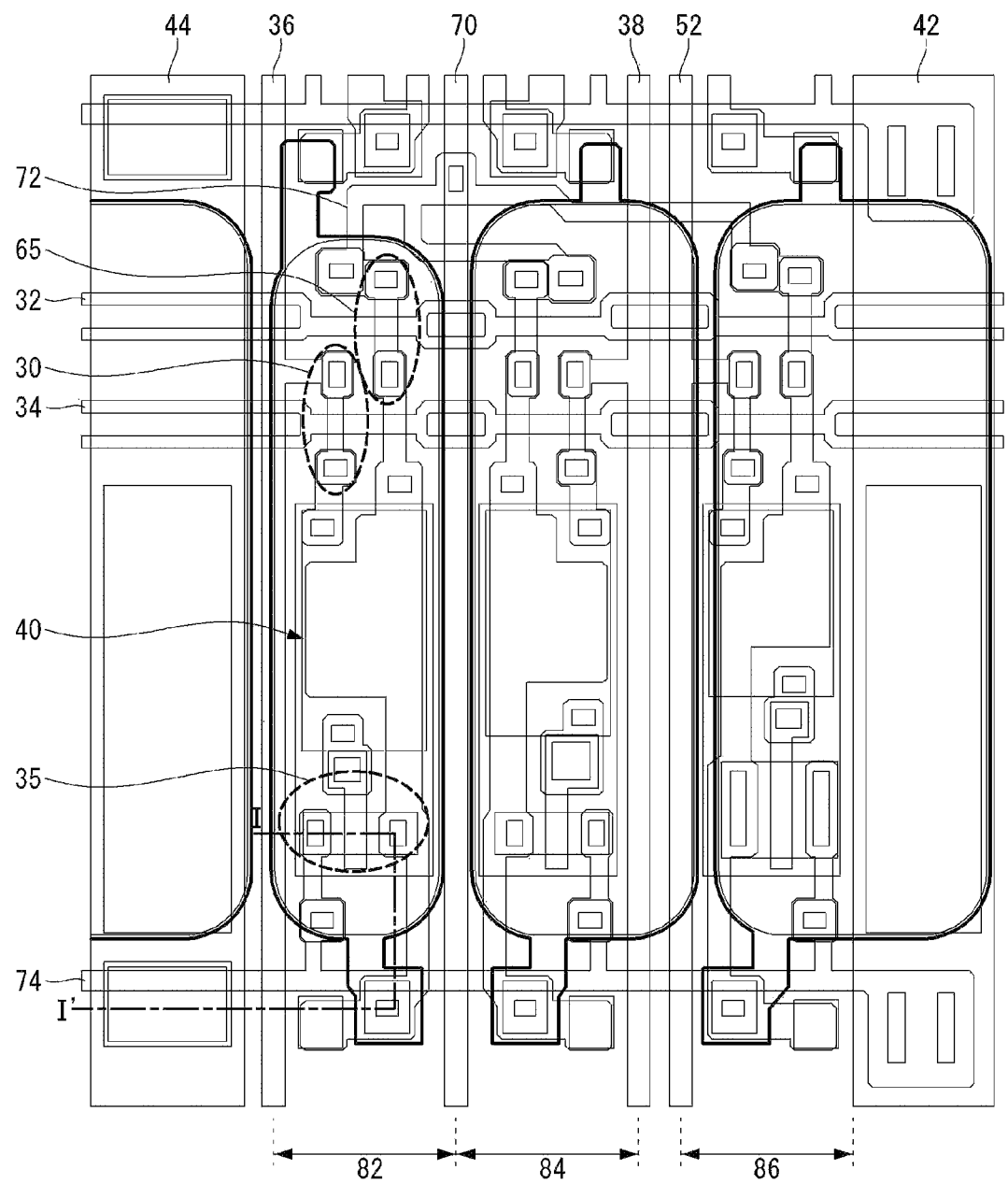
FIG. 4 is a schematic diagram showing a layout of sub-pixels according to the present disclosure.
Figure 5:
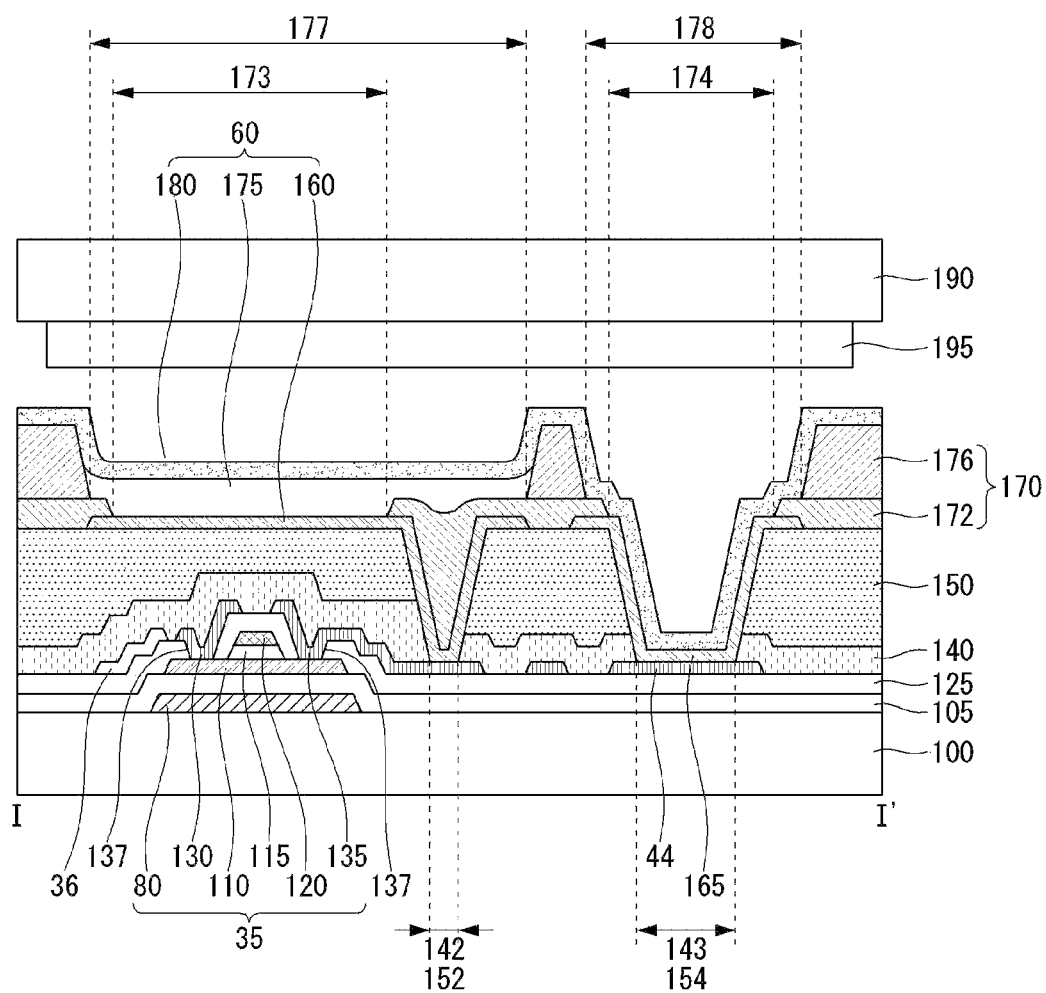
FIG. 5 is a cross-sectional view taken along line I-I' of FIG. 4.

FIG. 4 is a schematic diagram showing a layout of sub-pixels according to the present disclosure and FIG. 5 is a cross-sectional view taken along line I-I' of FIG. 4.

Referring to FIG. 4, a first sub-pixel 82, a second sub-pixel 84 and a third sub-pixel 86 are formed in a display area of a substrate. A circuit including the organic light-emitting diode (light-emitting element), and the switching transistor 30, the sensing transistor 65, the capacitor 40 and the driving transistor 35 for driving the organic light-emitting diode is formed in each of the first, second and third sub-pixels 82, 84 and 86. In each of the first, second and third sub-pixels 82, 84 and 86, the organic light-emitting diode emits light in response to operations of the switching transistor 30, the sensing transistor 65, the capacitor 40 and the driving transistor 35. The power line 42, the sensing line 70 and the first to third data lines 36, 38 and 52 are disposed between the first, second and third sub-pixels 82, 84 and 86. The first and second gate lines 32 and 34 are disposed to cross the first, second and third sub-pixels 82, 84 and 86.

Although lines such as the power line 42, the sensing line 70 and the first to third data lines 36, 38 and 52 and the electrodes constituting the thin film transistors are disposed at different levels, they are electrically connected through contact holes (or via holes). The sensing line 70 is connected to the sensing transistors 65 of the first, second and third sub-pixels 82, 84 and 86 through a sensing connection line 72. The power line 42 is connected to the driving transistors 35 of the first, second and third sub-pixels 82, 84 and 86 through a power connection line 74. The first and second gate lines 32 and 34 are connected to the sensing and switching transistors 65 and 30 of the first, second and third sub-pixels 82, 84 and 86.

The aforementioned first sub-pixel 82 may be a red sub-pixel, the second sub-pixel 84 may be a green sub-pixel and the third sub-pixel 86 may be a blue sub-pixel. However, the positions at which the sub-pixels are disposed may be changed.

A cross-sectional structure of the first sub-pixel among the first to third sub-pixels will be described as an example with reference to FIG. 5.

Referring to FIG. 5, the light shielding layer 80 is disposed on a substrate 100. The light shielding layer 80 serves to block external light and prevent photoelectric current from being generated in transistors. A buffer layer 105 is disposed on the light shielding layer 80. The buffer layer 105 serves to protect the transistors to be formed in the subsequent processes from impurities such as alkali ions leaking from the light shielding layer 80. The buffer layer 105 may be a silicon oxide (SiOx) layer, a silicon nitride (SiNx) layer or a multilayer thereof.

A semiconductor layer 110 of the driving transistor 35 is disposed on the buffer layer 105. The semiconductor layer 110 may be formed of silicon, an oxide or an organic semiconductor. A silicon semiconductor layer may be formed using amorphous silicon or polysilicon obtained by crystallizing amorphous silicon. An oxide semiconductor layer may be formed of any one of zinc oxide (ZnO), indium zinc oxide (InZnO), indium gallium zinc oxide (InGaZnO) and zinc tin oxide (ZnSnO). An organic semiconductor layer may be formed of a low molecular or high molecular organic material such as merocyanine, phthalocyanine, pentacene and thiophene polymer. The semiconductor layer 110 includes a drain region and a source region containing p-type or n-type impurities and a channel interposed therebetween.

A gate insulating layer 115 is disposed on the semiconductor layer 110. The gate insulating layer 115 may be a silicon oxide (SiOx) layer, a silicon nitride (SiNx) layer or a multilayer thereof. A gate electrode 120 is disposed on a region of the gate insulating layer 115 which corresponds to a predetermined region of the semiconductor layer 110, that is, a channel when impurities have been injected thereinto. The gate electrode 120 is formed of one of molybdenum (Mo), aluminum (Al), chrome (Cr), gold (Au), titanium (Ti), nickel (Ni), neodymium (Nd) and copper (Cu) or an alloy thereof. Further, the gate electrode 120 may be a multilayer formed of one of molybdenum (Mo), aluminum (Al), chrome (Cr), gold (Au), titanium (Ti), nickel (Ni), neodymium (Nd) and copper (Cu) or alloys thereof. For example, the gate electrode 120 may be a double layer of molybdenum/aluminum-neodymium or molybdenum/aluminum.

An interlayer insulating layer 125 for insulating the gate electrode 120 is disposed on the gate electrode 120. The interlayer insulating layer 125 may be a silicon oxide (SiOx) layer, a silicon nitride (SiNx) layer or a multilayer thereof. A source electrode 130 and a drain electrode 135 are disposed on the interlayer insulating layer 125. The source electrode 130 and the drain electrode 135 are connected to the semiconductor layer 110 through contact holes 137 which expose the source and drain regions of the semiconductor layer 110. The source electrode 130 and the drain electrode 135 may be formed of a single layer or a multi-layer. When the source electrode 130 and the drain electrode 135 are a single layer, they may be formed of one of molybdenum (Mo), aluminum (Al), chrome (Cr), gold (Au), titanium (Ti), nickel (Ni), neodymium (Nd) and copper (Cu) or an alloy thereof. Further, when the source electrode 130 and the drain electrode 135 are a multilayer, they may be formed of a double layer of molybdenum/aluminum-neodymium or a tri-layer of titanium/aluminum/titanium, molybdenum/aluminum/molybdenum or molybdenum/aluminum-neodymium/molybdenum. The first data line 36 is disposed in a region distant from the driving transistor 35 and the cathode power line 44 is disposed in another region distant from the driving transistor 35.

Accordingly, the driving transistor 35 including the semiconductor layer 110, the gate electrode 120, the source electrode 130 and the drain electrode 135 is formed.

A passivation layer 140 is disposed on the interlayer insulating layer 125 including the driving transistor 35. The passivation layer 140 is an insulating layer for protecting elements formed thereunder and may be a silicon oxide (SiOx) layer, a silicon nitride (SiNx) layer or a multilayer thereof. The passivation layer 140 includes a first via hole 142 which exposes a portion of the drain electrode 135 of the driving transistor 35 disposed thereunder and a second via hole 143 which exposes a portion of the cathode power line 44.

An overcoat layer 150 is disposed on the passivation layer 140. The overcoat layer 150 may be a planarization layer for mitigating stepped portions of the understructure and may be formed of an organic material such as polyimide, benzocyclobutene series resin and acrylate. The overcoat layer 150 includes a third via hole 152 which exposes the first via hole 142 of the passivation layer 140 to expose a portion of the drain electrode 135 and a fourth via hole 154 which exposes a portion of the second via hole 143 of the passivation layer 140 to expose a portion of the cathode power line 44.

The organic light-emitting diode 60 is formed on the overcoat layer 150. The organic light-emitting diode 60 includes a first electrode 160 connected to the driving transistor 35, a second electrode 180 disposed opposite to the first electrode 160, and an organic light emitting layer 175 interposed between the first electrode 160 and the second electrode 180. The first electrode 160 may be an anode and the second electrode 180 may be a cathode.

The first electrode 160 is disposed on the overcoat layer 150 and may be connected to the drain electrode 135 of the driving transistor 35 through the third via hole 152 of the overcoat layer 150 and the first via hole 142 of the passivation layer 140. Although the first electrode 160 may be allocated per sub-pixel, the present disclosure is not limited thereto. The first electrode 160 may serve as a transmissive electrode by being formed of a transparent conductive material such as an indium tin oxide (ITO), indium zinc oxide (IZO) and zinc oxide (ZnO) or serve as a reflective electrode by including a reflective layer according to an adopted emission method. The reflective layer may be formed of aluminum (Al), copper (Cu), silver (Ag), nickel (Ni) or an alloy thereof and may be formed of APC (silver/palladium/copper alloy).

A connection pattern 165 connected to the cathode power line 44 through the fourth via hole 154 of the overcoat layer 150 and the second via hole 143 of the passivation layer 140 is disposed on a portion of the overcoat layer 150 which is separated from the first electrode 160. The connection pattern 165 is formed in the same structure as the first electrode 160.

A bank layer 170 is disposed on the substrate 100 on which the first electrode 160 is formed. The bank layer 170 includes a first bank layer 172 and a second bank layer 176. The first bank layer 172 includes a first opening 173 which exposes the first electrode 160 and the second bank layer 176 includes a second opening 177 which exposes a part of the first bank layer 172 and the first electrode 160. The second opening 177 may be formed to be larger than the first opening 173 to expose a part of the first bank layer 172.

In addition, the first bank layer 172 includes a third opening 174 which exposes the connection pattern 165 and the second bank layer 176 includes a fourth opening 178 which exposes a part of the first bank layer 172 and the connection pattern 165. The fourth opening 178 may be formed to be larger than the third opening 174 to expose a part of the first bank layer 172.

The organic light emitting layer 175 is disposed on the substrate 100 on which the bank layer 170 is formed. The organic light emitting layer 175 includes a light emitting layer (EL) and may further include at least one of a hole injection layer (HIL), a hole transport layer (HTL), an electron transport layer (ETL) and an electron injection layer (EIL). The organic light emitting layer 175 may be coated through a solution process such as inkjet printing or nozzle coating and dried such that the top surface of the organic light emitting layer 175 which contacts the bank layer 170 can be rounded.

The second electrode 180 is disposed on the organic light emitting layer 175. The second electrode 180 may be formed on the overall surface of the substrate 100. The second electrode 180 may serve as a transmissive electrode or a reflective electrode according to an adopted emission method. When the second electrode 180 is a transmissive electrode, the second electrode 180 may be formed of a transparent conductive material such as ITO and IZO, or magnesium (Mg), calcium (Ca), aluminum (Al), silver (Ag) or an alloy thereof which is as thin as light can pass. The second electrode 180 is connected to the cathode power line 44 by being connected to the connection pattern 165 through the third opening 174 of the first bank layer 172 and the fourth opening 178 of the second bank layer 176.

Meanwhile, an opposite substrate 190 is disposed opposite the substrate 100 on which the driving transistor 35 and the organic light-emitting diode 60 are formed. The opposite substrate 190 is for sealing the substrate 100 and includes a color filter 195 disposed on the lower surface thereof. The color filter 195 may be a red color filter and serves to deepen color coordinates of red. For example, when the first sub-pixel is a red sub-pixel, the opposite substrate 190 may include a red color filter in a region corresponding to the first sub-pixel. In addition, regions of the opposite substrate 190 which correspond to the second sub-pixel that is a green sub-pixel and the third sub-pixel that is a blue sub-pixel may not include any color filter. However, the present disclosure describes an example and all sub-pixels may include color filters having colors corresponding thereto. The structure shown in FIG. 5 can be equally applied to not only the corresponding sub-pixels but also other sub-pixels.

The organic light-emitting display device described above with reference to FIGS. 1 to 5 will be described in more detail below.

Figure 6:
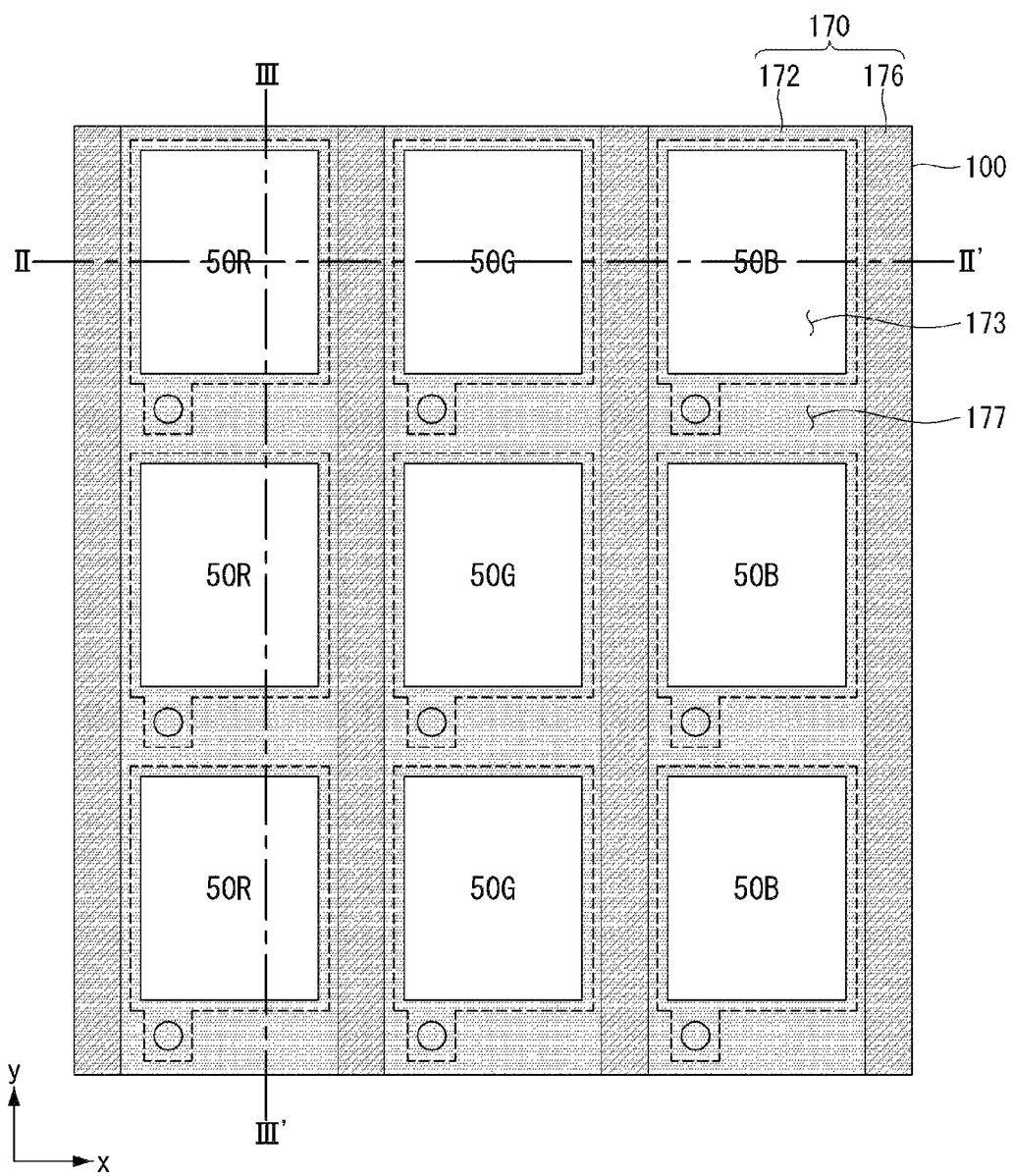
FIG. 6 is a plan view showing an organic light-emitting display device according to an aspect of the present disclosure.
Figure 7:
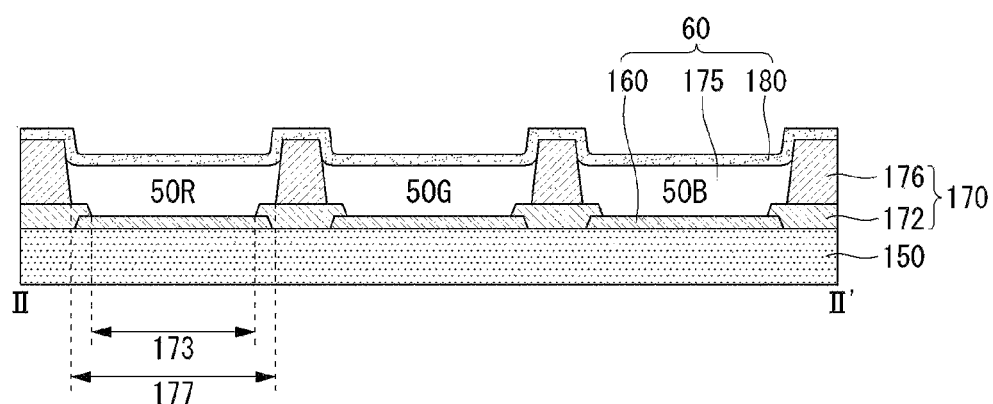
FIG. 7 is a cross-sectional view taken along line II-II' of FIG. 6.
Figure 8:
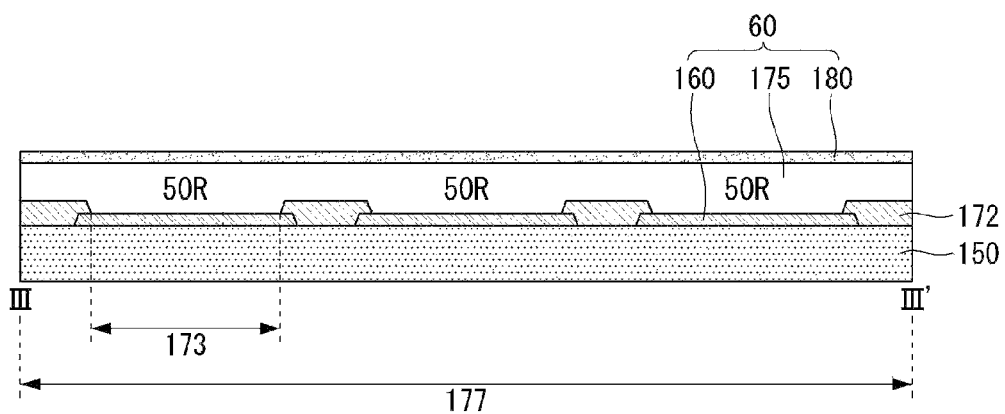
FIG. 8 is a cross-sectional view taken along line III-III' of FIG. 6.
Figure 9:
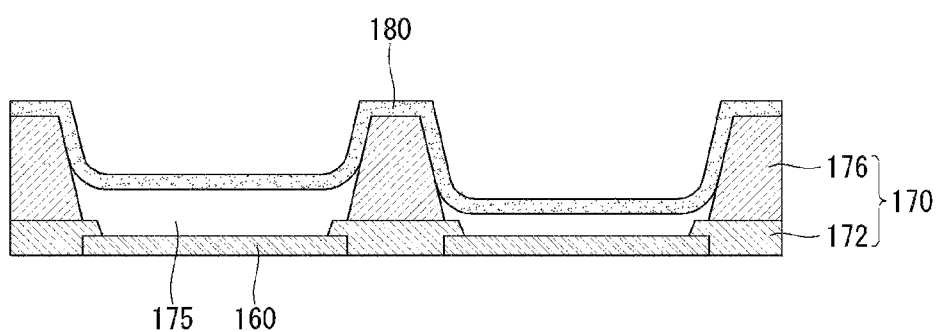
FIG. 9 is a cross-sectional view showing non-uniform thickness of an organic light emitting layer formed by a solution process.
Figure 10:
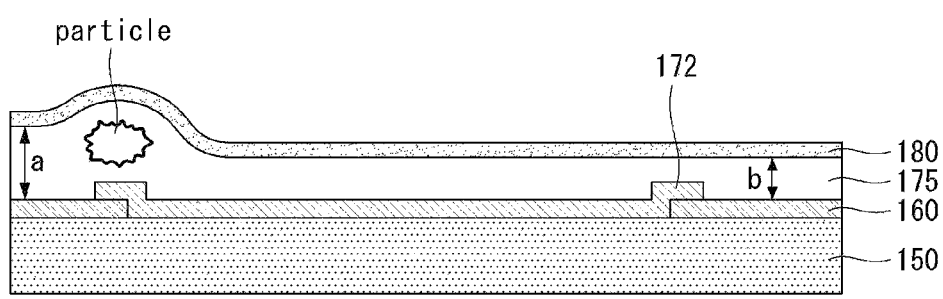
FIG. 10 is a cross-sectional view showing defects in an organic light-emitting diode caused by particles.

FIG. 6 is a plan view showing the organic light-emitting display device according to an aspect of the present disclosure, FIG. 7 is a cross-sectional view taken along line II-II' of FIG. 6, FIG. 8 is a cross-sectional view taken along line III-III' of FIG. 6, FIG. 9 is a cross-sectional view showing ununiform thickness of an organic light emitting layer in a solution process, and FIG. 10 is a cross-sectional view showing defects in an organic light-emitting diode caused by particles.

Referring to FIGS. 6 and 7, the organic light-emitting display device according to an aspect of the present disclosure includes the substrate 100 on which a plurality of sub-pixels 50R, 50G and 50B are arranged. The substrate 100 may have various plane shapes. For example, the substrate 100 may have square, circular and oval shapes as well as a rectangular shape shown in the figures.

The aforementioned thin film transistors, capacitor and organic light-emitting diode are disposed on the substrate 100. The organic light-emitting diode includes the first electrode 160, the organic light emitting layer 175 and the second electrode 180. Emission regions of the sub-pixels 50R, 50G and 50B are defined by the bank layer 170. The bank layer 170 is described in detail in FIG. 6 and thus illustration of other components is omitted.

The sub-pixels 50R, 50G and 50B may be arranged in a first direction (e.g., X-axis direction) and a second direction (e.g., Y-axis direction) which intersect each other. Sub-pixels arranged in the first direction may emit lights having different colors and sub-pixels arranged in the second direction may emit light having the same color. For example, the red sub-pixel 50R, the green sub-pixel 50G and the blue sub-pixel 50B may be repeatedly arranged in the first direction, and the sub-pixels arranged in the second reaction may be arranged in such a manner that the red sub-pixels 50R are arranged in the first column, the green sub-pixels 50G are arranged in the second column and the blue sub-pixels 50B are arranged in the third column. However, the present disclosure describes an example of sub-pixel arrangement and the sub-pixels may be arranged in various manners.

The first electrode 160 of the organic light-emitting diode is disposed on each of the sub-pixels 50R, 50G and 50B. The bank layer 170 is disposed on the first electrode 160 to define an emission region. The bank layer 170 includes the first bank layer 172 and the second bank layer 176.

The first bank layer 172 is positioned on the first electrode 160 to cover the edge of the first electrode 160. The first bank layer 172 includes the first openings 173 each of which exposes at least a part of the first electrode 160. One first opening 173 exposes one first electrode 160. Accordingly, the first openings 173 can one-to-one correspond to the first electrodes 160.

The first bank layer 172 may be formed to be relatively thin such that it can be covered by an organic light emitting layer formed thereon. The first bank layer 172 may have hydrophilicity and may be formed of a hydrophilic inorganic material such as silicon oxide (SiOx) and silicon nitride (SiNx), for example.

Although FIG. 6 illustrates an example in which the first openings 173 have a rectangular shape, the present disclosure is not limited thereto. Further, FIG. 6 illustrates that the first openings 173 have the same shape and area, but the present disclosure is not limited thereto and at least one first opening 173 may have a shape and/or an area different from those of other ones. For example, the shapes and/or the areas of the first openings 173 may be appropriately selected in consideration of the durability of an organic emission material for forming the organic light emitting layer of the organic light-emitting diode. A region of the first electrode 160 exposed by the first opening 173 can be defined as an emission region.

The second bank layer 176 is disposed on the substrate 100 on which the first bank layer 172 is formed. The second bank layer 176 is positioned between sub-pixels emitting lights having different colors among the sub-pixels. The second bank layer 176 includes the second openings 177 each of which exposes at least a part of the first electrode 160. The second openings 177 are arranged in parallel in the first direction and extend in the second direction. The second openings 177 extend in the second direction to expose the first electrodes 160 of the sub-pixels arranged in the second direction. Further, the second openings 177 extend in the second direction to expose the first openings 173 arranged in the second direction.

The second bank layer 176 may have hydrophobicity. For example, the second bank layer 176 may be formed by coating a hydrophobic material on an insulating layer or formed of a hydrophobic material. The second bank layer 176 may be formed of an organic material. The organic emission material of the organic light emitting layer can converge toward the center of the emission region according to hydrophobicity of the second bank layer 176. Further, the second bank layer 176 can serve as a barrier that confines organic emission materials dropped on the corresponding regions to prevent organic emission materials having different colors from being mixed.

Although FIG. 6 illustrates an example in which the second openings 177 have a bar shape, the present disclosure is not limited thereto. In addition, FIG. 6 illustrates that the second openings 177 have the same shape and area, but the present disclosure is not limited thereto and at least one second opening 177 may have a shape and/or an area different from those of other ones. For example, the shapes and/or the areas of the second openings 177 may be appropriately selected in consideration of the durability of the organic emission material.

The second openings 177 are positioned distant from the outer sides of the first openings 173. That is, the boundary of the first bank layer 172 is separated from the boundary of the second bank layer 176 by a predetermined distance. Accordingly, the first openings 173 can be exposed by the second openings 177 and the first bank layer 172 can be exposed by the second bank layer 176.

Structures of the first electrode, the bank layers, the organic light emitting layer and the second electrode will be described with reference to FIGS. 7 and 8. In FIGS. 7 and 8, structures under the overcoat layer 150 are omitted and the structures of the first electrode, the bank layers, the organic light emitting layer and the second electrode are described in detail. The omitted structures under the overcoat layer 150 include the semiconductor layer 110, the gate electrode 120, the source electrode 130 and the drain electrode 135 of the driving transistor 35 disposed under the first electrode 160 in FIG. 5. Further, the light shielding layer 80 disposed under the driving transistor 35 and the cathode power line 44 disposed in a region distant from the driving transistor 35 are also omitted.

The first electrodes 160 of the respective sub-pixels are disposed on the overcoat layer 150, and the edges of the first electrodes 160 are covered by the first bank layer 172 and thus parts thereof are exposed. The second bank layer 176 is positioned on the first bank layer 172.

The organic light emitting layer 175 is disposed on the substrate on which the second bank layer 176 is formed. The organic light emitting layer 175 may be formed in the second openings 177 of the second bank layer 176 in a direction in which the second openings 177 extend. That is, the organic emission material dropped on one second opening 177 covers the first electrodes 160 and the first bank layer 172 exposed by the second opening 177. The organic emission material completely covers the first bank layer 172 and thus is not separated by the first bank layer 172 but is separated by the second band layer 176.

An organic emission material having a color is dropped on a plurality of first electrodes 160 exposed by one second opening 177. This means that sub-pixels allocated to a region corresponding to one second opening 177 emit lights having the same color. The plane shape of the organic light emitting layer 175 corresponds to the plane shape of the second opening 177 and may be a bar shape, for example.

Organic emission materials having different colors may be sequentially alternately dropped on corresponding second openings 177. The organic emission materials having different colors may be organic emission materials emitting red, green and blue lights.

The second bank layer 176 is positioned between first electrodes 160 neighboring in the first direction (e.g., X-axis direction of FIG. 6) to prevent organic emission materials having different colors dropped on second openings 177 neighboring in the first direction from being mixed. That is, organic emission materials having different colors dropped on different second openings 177 are physically separated by the second bank layer 176.

An organic emission material used to form the organic light emitting layer 175 is dropped to cover at least a part of the first electrode 160, a part of the first bank layer 172 and a part of the second bank layer 176 in a solution process. The first bank layer 172 may be formed from a hydrophilic thin film for preventing wettability deterioration due to hydrophobicity of the first electrode 160 to induce a hydrophilic organic emission material to well spread. The second bank layer 176 is a hydrophobic thick film and causes the hydrophilic organic emission material to converge toward the center region. The organic light emitting layer 175 can be formed to a relatively uniform thickness in the emission region according to the structures of the first bank layer 172 and the second bank layer 176.

In the present disclosure, a plurality of sub-pixels emitting lights having the same color may be allocated to one second opening 177. If the second openings 177 expose respective sub-pixels, organic emission materials dropped on the second openings 177 may have different thicknesses due to an equipment deviation during the solution process. The equipment deviation may refer to a discharge rate deviation between nozzles of an inkjet apparatus. That is, nozzles used to drop organic emission materials on the second openings 177 may not have a uniform discharge rate.

In this case, organic emission materials dropped on sub-pixels through nozzles allocated to the sub-pixels may have different thicknesses according to locations, as shown in FIG. 9.

Accordingly, the present disclosure allocates a plurality of sub-pixels to one second opening 177 and allocates a plurality of nozzles corresponding to the number of sub-pixels, and thus a discharge rate deviation between nozzles can be compensated and organic emission materials dropped on the second openings 177 can have a uniform thickness. Accordingly, the organic light-emitting display device according to the present disclosure can prevent deterioration of thickness uniformity of the organic light emitting layer 175 to prevent display quality deterioration caused by thickness deviations in sub-pixels. In addition, uniformity of the organic light emitting layer 175 can be secured to prevent decrease in the lifespan of elements and defects with respect to generation of dark spots.

The aforementioned predetermined distance between the boundary of the first bank layer 172 and the boundary of the second bank layer 176 refers to a minimum distance that can secure thickness uniformity of the organic light emitting layer 175. If the boundary of the first bank layer 172 and the boundary of the second bank layer 176 are closer to each other than the predetermined distance, uniformity of the organic light emitting layer 175 cannot be secured. If the boundary of the first bank layer 172 and the boundary of the second bank layer 176 are separated from each other by more than the predetermined distance, the area of the first electrode 160 covered by the first bank layer 172 may increase to decrease an aperture ratio.

In the organic light-emitting display device according to the present disclosure, the second bank layer 176 is not disposed between sub-pixels arranged in the second direction because the second openings 177 of the second bank layer 176 extend in the second direction. Accordingly, the present disclosure can improve the degree of freedom in design and secure a wide emission region on the first electrode 160 because the aforementioned positional restriction on the first bank layer 172 is relatively reduced. Hence, the present disclosure can provide an organic light-emitting display device with an improved degree of freedom in design and a sufficient aperture ratio.

Furthermore, the areas of sub-pixels arranged in a display device relatively decrease as resolution increases. In this case, organic emission materials are not dropped at proper positions and thus color mixing of organic light emitting layers 175 having different colors may occur. The present disclosure can secure a sufficient organic emission material dispensing area in the wide second opening 177 corresponding to a plurality of sub-pixels to prevent color mixing.

Referring to FIG. 10, when a particle is present under the organic light emitting layer 175, a dropped organic emission material is not well spread due to the particle and thus the thickness a of the organic light emitting layer 175 of a sub-pixel close to the particle is relatively thick and the thickness b of the organic light emitting layer 175 of a sub-pixel neighboring the sub-pixel is relatively thin. Accordingly, a luminance deviation between sub-pixels may be generated to decrease display quality. Further, an organic light emitting layer thickness difference may be generated between neighboring sub-pixels due to presence of particles or other causes. Accordingly, a luminance deviation between sub-pixels may be generated to decrease display quality.

To prevent this, arrangement of the first electrodes 160 can be changed to adjust arrangement of the bank layer 170 in an aspect of the present disclosure.

Figure 11:
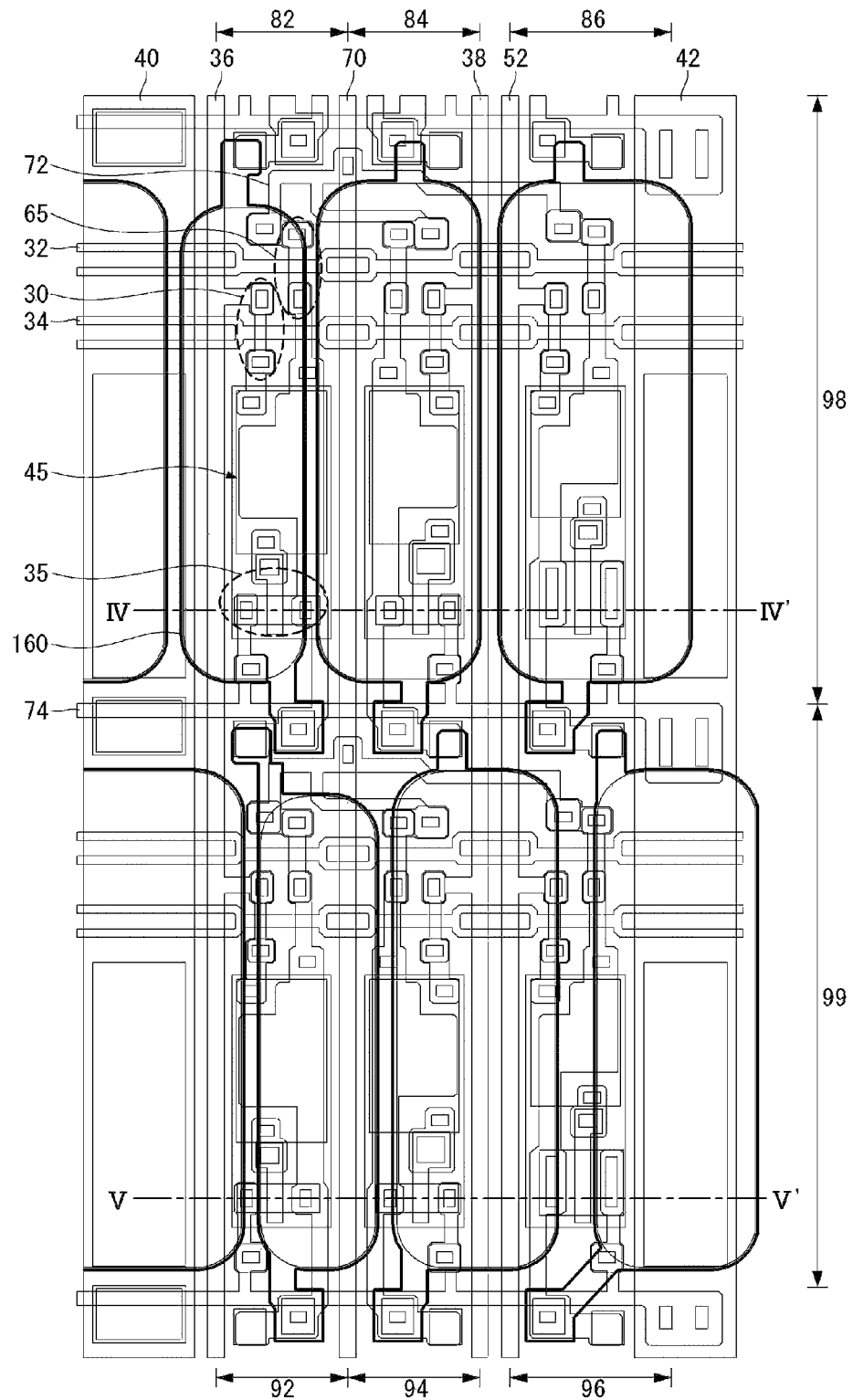
FIG. 11 is a plan view showing sub-pixels according to an aspect of the present disclosure.
Figure 12:
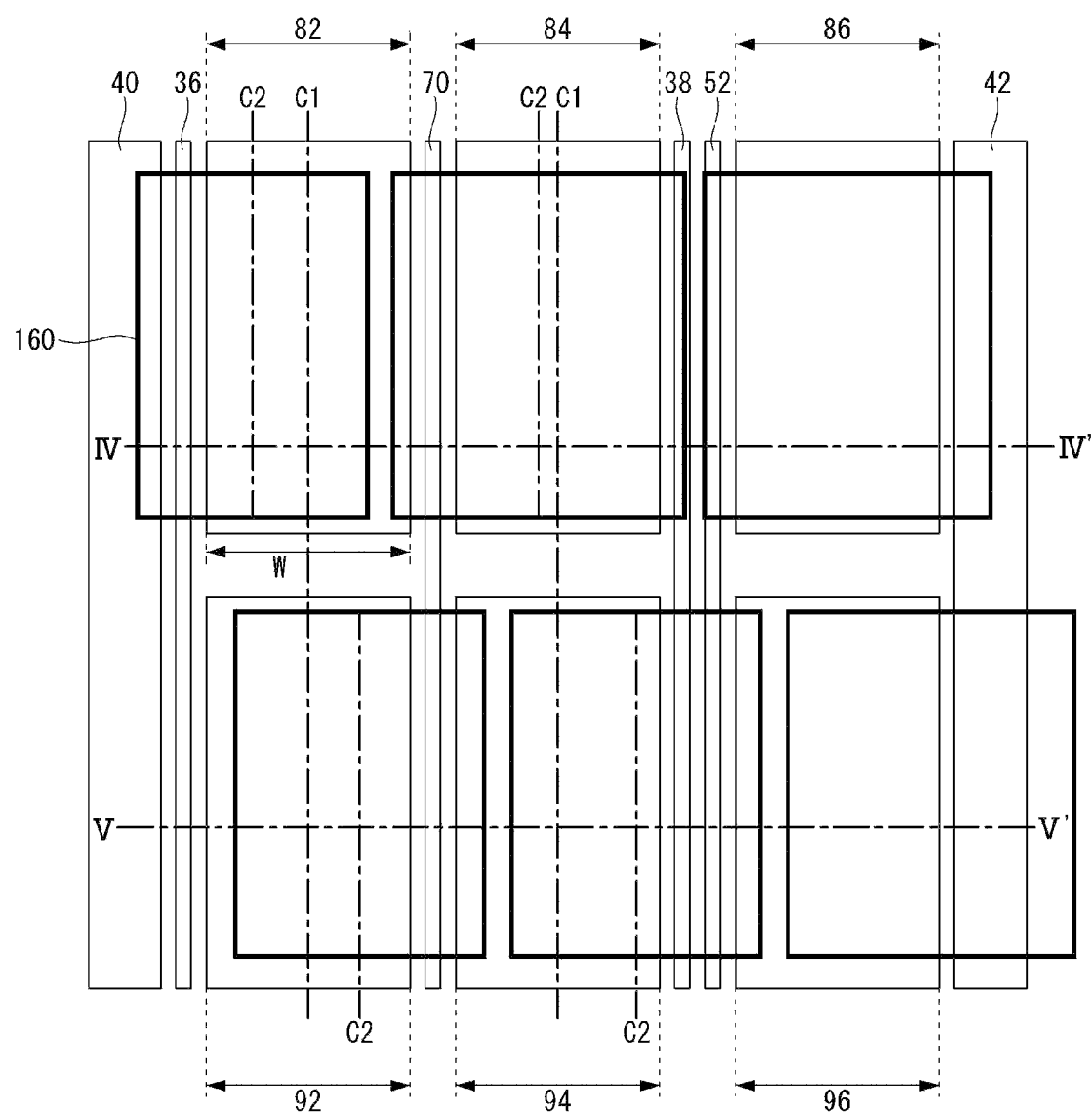
FIG. 12 is a schematic plan view showing a layout of the sub-pixels shown in FIG. 11.
Figure 13:
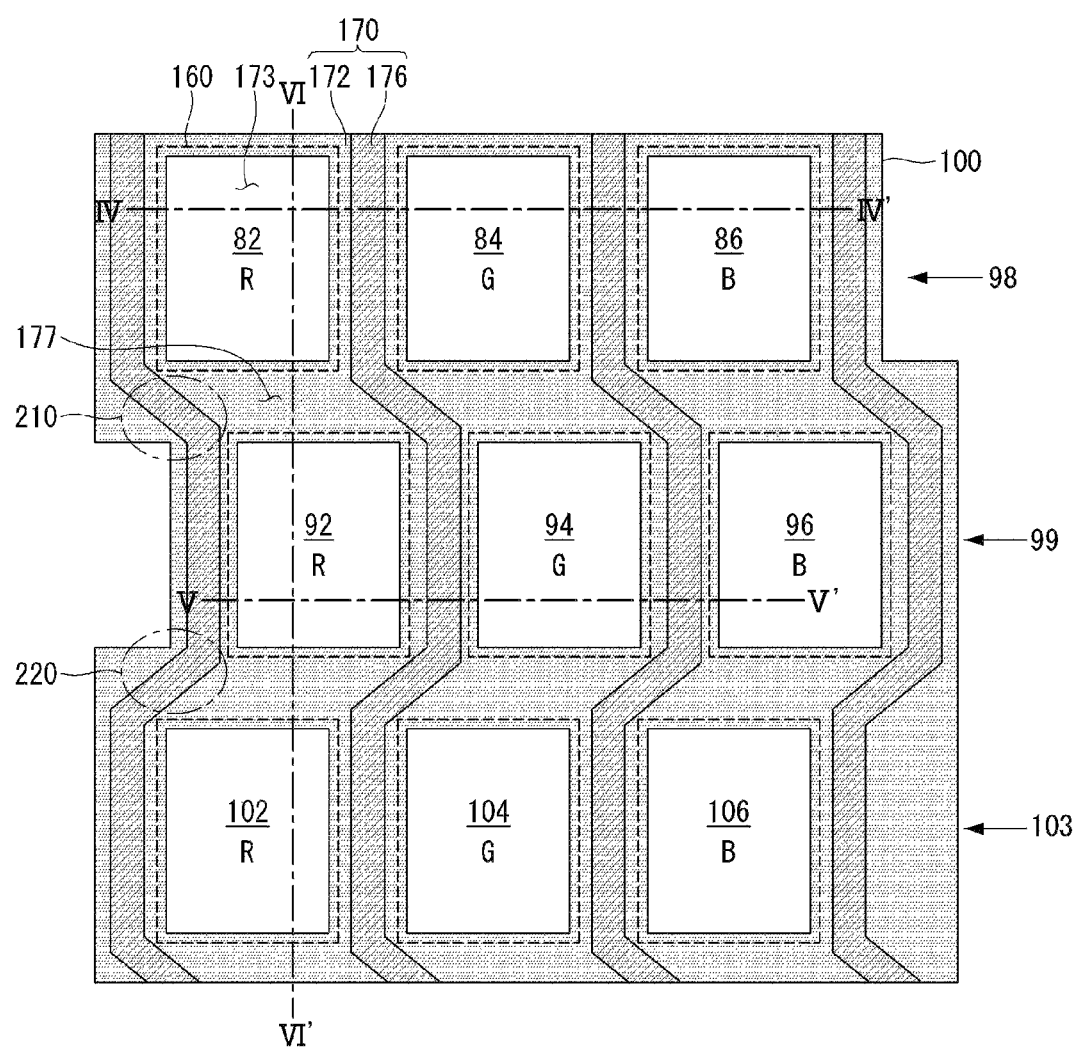
FIG. 13 is a plan view showing an organic light-emitting display device according to an aspect of the present disclosure.
Figure 14:
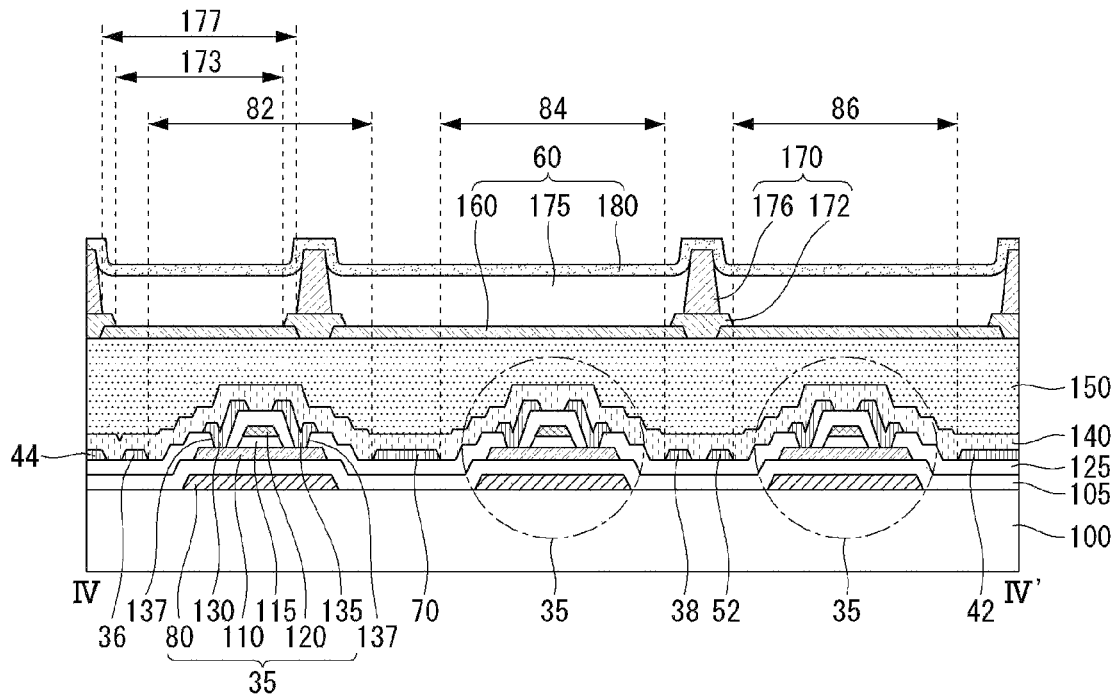
FIG. 14 is a cross-sectional view taken along line IV-IV' of FIG. 11.
Figure 15:
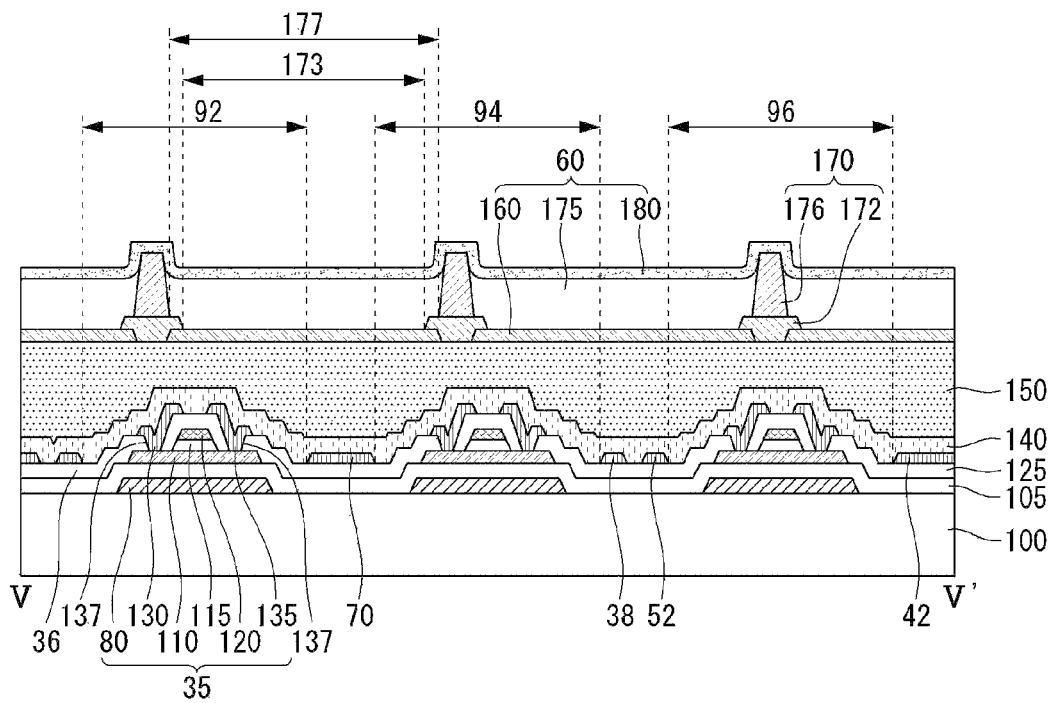
FIG. 15 is a cross-sectional view taken along line V-V' of FIG. 11.
Figure 16:
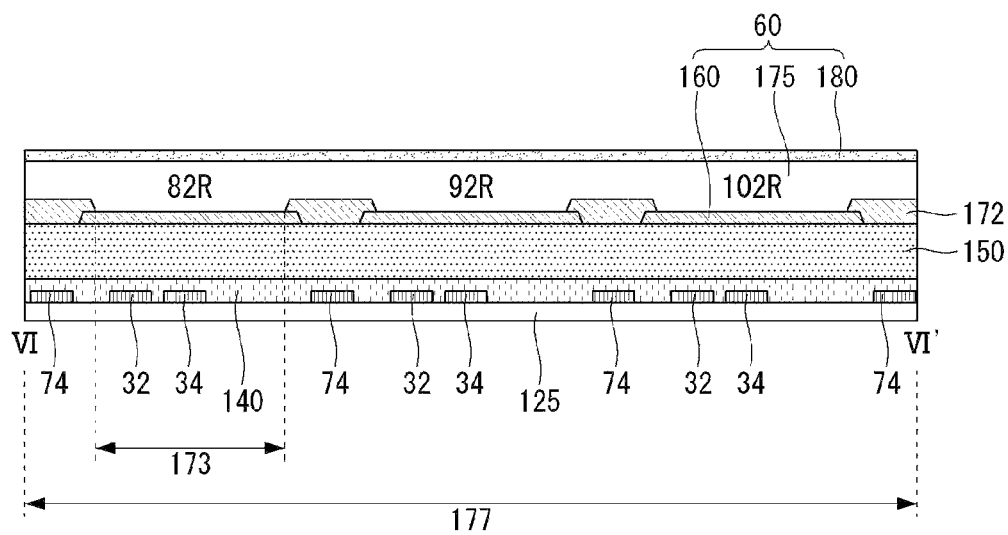
FIG. 16 is a cross-sectional view taken along line VI-VI' of FIG. 11.
Figure 17:
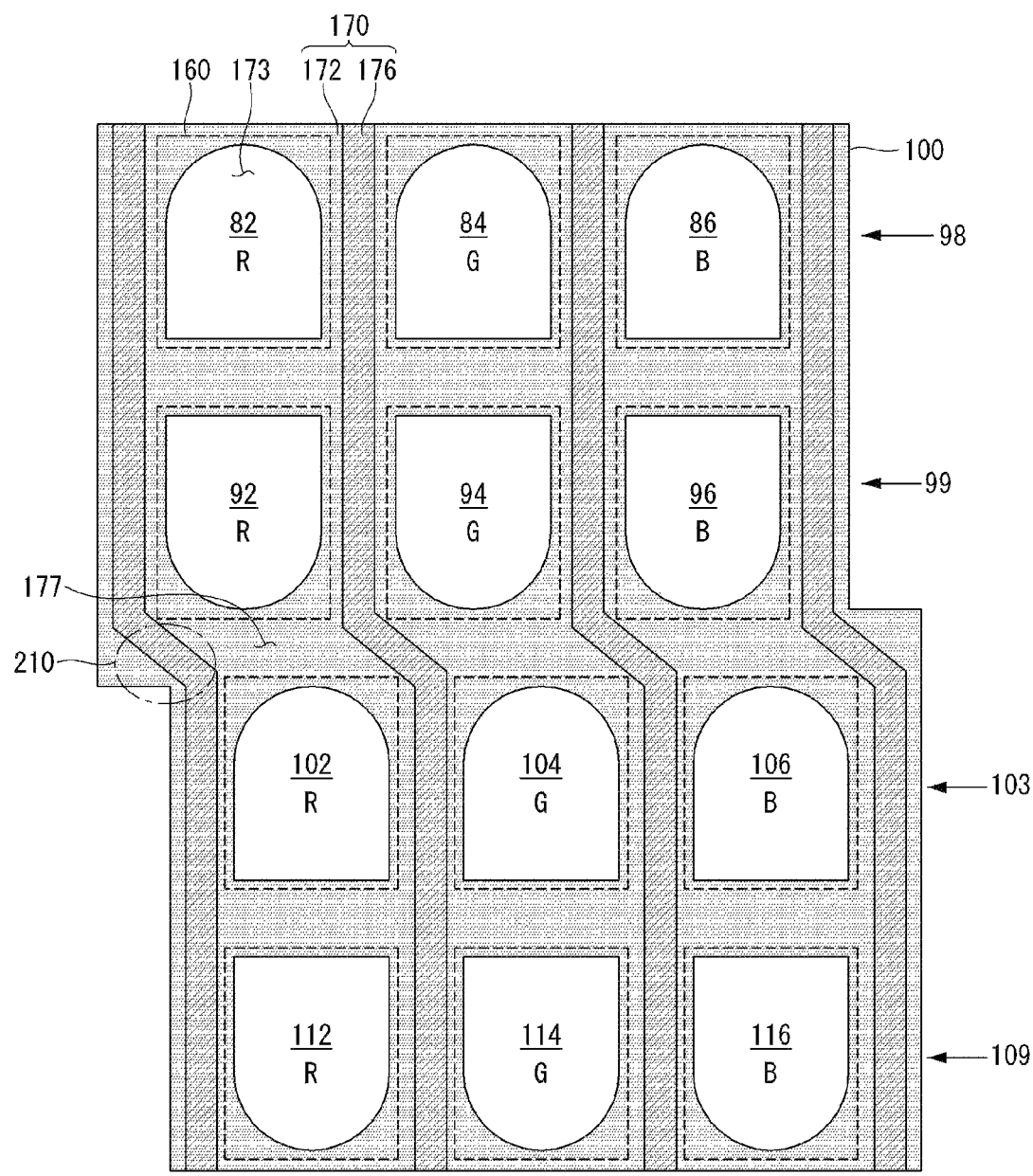
FIG. 17 is a plan view showing sub-pixels according to an aspect of the present disclosure.

FIG. 11 is a plan view showing sub-pixels according to an aspect of the present disclosure, FIG. 12 is a schematic plan view showing a layout of the sub-pixels shown in FIG. 11, FIG. 13 is a plan view showing the organic light-emitting display device according to an aspect of the present disclosure, FIG. 14 is a cross-sectional view taken along line IV-IV' of FIG. 11, FIG. 15 is a cross-sectional view taken along line V-V' of FIG. 11, FIG. 16 is a cross-sectional view taken along line VI-VI' of FIG. 11, and FIG. 17 is a plan view showing sub-pixels according to an aspect of the present disclosure.

Referring to FIG. 11, a plurality of sub-pixels is arranged in a display area of a substrate. A first sub-pixel 82, a second sub-pixel 84 and a third sub-pixel 86 are arranged in a first horizontal line 98 and a fourth sub-pixel 92, a fifth sub-pixel 94 and a sixth sub-pixel 96 are arranged in a second horizontal line 99 disposed under the first horizontal line 98.

A circuit including an organic light-emitting diode, and a switching transistor 30, a sensing transistor 65, a capacitor 45 and a driving transistor 35 which drive the organic light-emitting diode is formed in each of the first to sixth sub-pixels 82, 84, 86, 92, 94 and 96. The first electrode 160 of the organic light-emitting diode is connected to the driving transistor 35. The organic light-emitting diode emits light in response to operations of the switching transistor 30, the capacitor 45, the sensing transistor 65 and the driving transistor 35 in each of the first to sixth sub-pixels 82, 84, 86, 92, 94 and 96.

A power line 42, a sensing line 70 and first to third data lines 36, 38 and 52 are arranged in the first to sixth sub-pixels 82, 84, 86, 92, 94 and 96.

For example, the first to third sub-pixels 82, 84 and 86 arranged in the first horizontal line 98 are described. First and second gate lines 32 and 34 are disposed to cross the first, second and third sub-pixels 82, 84 and 86. Although lines such as the power line 42, the sensing line 70 and the first to third data lines 36, 38 and 52 and the electrodes constituting the thin film transistors are disposed at different levels, they are electrically connected through contact holes (via holes).

The sensing line 70 is connected to the sensing transistors 65 of the first, second and third sub-pixels 82, 84 and 86 through a first sensing connection line 72. The power line 42 is connected to the driving transistors 35 of the first, second and third sub-pixels 82, 84 and 86 through a power connection line 74. The first and second gate lines 32 and 34 are connected to the sensing and switching transistors 65 and 30 of the first, second and third sub-pixels 82, 84 and 86.

The aforementioned first and fourth sub-pixels 82 and 92 may be red sub-pixels, the second and fifth sub-pixels 84 and 94 may be green sub-pixels and the third and sixth sub-pixels 86 and 96 may be blue sub-pixels. However, the positions at which the sub-pixels are disposed may be changed.

The first electrodes 160 of the first to third sub-pixels 82, 84 and 86 arranged in the first horizontal line 98 of the present disclosure are shifted to one side from the regions of the sub-pixels and disposed. The first electrodes 160 of the fourth to sixth sub-pixels 92, 94 and 96 arranged in the second horizontal line 99 are shifted to the other side from the regions of the sub-pixels and disposed. For example, the first electrodes 160 of the first to third sub-pixels 82, 84 and 86 arranged in the first horizontal line 98 are shifted to the left and disposed and the first electrodes 160 of the fourth to sixth sub-pixels 92, 94 and 96 arranged in the second horizontal line 99 are shifted to the right and disposed.

Arrangement of the first electrodes 160 of the first to sixth sub-pixels 82, 84, 86, 92, 94 and 96 will be described with reference to FIG. 12.

Referring to FIG. 12, the first sub-pixel 82 arranged in the first horizontal line 98 has a first center line C1 extending in parallel with the first data line 36 and the first electrode 160 of the first sub-pixel 82 also has a second center line C2 extending in parallel with the first data line 36. Here, the second center line C2 of the first electrode 160 may be shifted to the left from the first center line C1 of the first sub-pixel 82 by 10 to 50% of the width W of the first sub-pixel 82. That is, the distance between the first center line C1 and the second center line C2 may be 10 to 50% of the width W of the first sub-pixel 82.

The second sub-pixel 84 has the first center line C1 and the first electrode 160 of the second sub-pixel 84 also has the second center line C2. Here, the second center line C2 of the first electrode 160 may be shifted to the left from the first center line C1 of the second sub-pixel 84 by 10 to 50% of the width W of the second sub-pixel 84. That is, the distance between the first center line C1 and the second center line C2 may be 10 to 50% of the width W of the second sub-pixel 84.

The third sub-pixel 86 is shifted having the same distance according to shifting of the first sub-pixel 82 and the second sub-pixel 84 and thus is not particularly limited.

Further, the fourth sub-pixel 92 arranged in the second horizontal line 99 has the first center line C1 extending in parallel with the first data line 36 and the first electrode 160 of the fourth sub-pixel 92 also has the second center line C2 extending in parallel with the first data line 36. Here, the second center line C2 of the first electrode 160 may be shifted to the right from the first center line C1 of the fourth sub-pixel 92 by 10 to 50% of the width W of the fourth sub-pixel 92. That is, the distance between the first center line C1 and the second center line C2 may be 10 to 50% of the width W of the fourth sub-pixel 92.

The fifth sub-pixel 94 has the first center line C1 and the first electrode 160 of the fifth sub-pixel 94 also has the second center line C2. Here, the second center line C2 of the first electrode 160 of the fifth sub-pixel 94 may be shifted to the right from the first center line C1 of the fifth sub-pixel 94 by 10 to 50% of the width W of the fifth sub-pixel 89. That is, the distance between the first center line C1 and the second center line C2 may be 10 to 50% of the width W of the fifth sub-pixel 94.

The sixth sub-pixel 96 is shifted having the same distance according to shifting of the fourth sub-pixel 92 and the fifth sub-pixel 94 and thus is not particularly limited.

The structures of the first bank layer and the second bank layer according to the above-described arrangement of the first electrodes of the sub-pixels will be described with reference to FIG. 13.

Referring to FIG. 13, the organic light-emitting display device according to an aspect of the present disclosure includes the substrate 100 on which a plurality of sub-pixels 82, 84, 86, 92, 94, 96, 102, 104 and 106 are arranged. Emission regions of the sub-pixels 82, 84, 86, 92, 94, 96, 102, 104 and 106 are defined by the bank layer 170. In FIG. 13, the bank layer 170 is described in detail and thus illustration of other components is omitted.

The sub-pixels 82, 84, 86, 92, 94, 96, 102, 104 and 106 may be arranged in the first direction (e.g., X-axis direction) and the second direction (e.g., Y-axis direction) which intersect each other. The first to third sub-pixels 82, 84 and 86 may be arranged in the first horizontal line 98, the fourth to sixth sub-pixels 92, 94 and 96 may be arranged in the second horizontal line 99, and seventh to ninth sub-pixels 102, 104 and 106 may be arranged in a third horizontal line 103.

The first electrode 160 of the organic light-emitting diode is disposed in each of the sub-pixels 82, 84, 86, 92, 94, 96, 102, 104 and 106. The bank layer 170 is disposed on the first electrodes 160 to define emission regions. The bank layer 170 includes the first bank layer 172 and the second bank layer 176.

The first bank layer 172 is positioned on the first electrodes 160 and covers the edges of the first electrodes 160. The first bank layer 172 includes the first openings 173 which expose at least parts of the first electrodes 160. One first opening 173 exposes one first electrode 160. Accordingly, the first openings 173 can one-to-one correspond to the first electrodes 160. Parts of the first electrodes 160 exposed by the first openings 173 can be defined as emission regions.

The second bank layer 176 is positioned on the substrate 100 on which the first band layer 172 is formed. The second bank layer 176 is positioned between sub-pixels emitting lights having different colors. The second bank layer 176 includes the second openings 177 which expose at least parts of the first electrodes 160.

In the present disclosure, the aforementioned first electrodes 160 are shifted to the left and disposed in the first horizontal line 98, shifted to the right and disposed in the second horizontal line 99 and shifted to the left and disposed in the third horizontal line 103 as in the first horizontal line 98. The first electrodes 160 of the respective sub-pixels are arranged with such regularity. Accordingly, the first openings 173 of the first bank layer 172 which define the emission regions while covering the edges of the first electrodes 160 may be arranged zigzag according to arrangement of the first electrodes 160.

Further, since the second bank layer 176 disposed on the first bank layer 172 needs to expose the first openings 173 of the first bank layer 172, the second bank layer 176 and the second openings 177 of the second bank layer 176 may also be arranged zigzag.

Specifically, the second bank layer 176 and the second openings 177 are bent in a first direction on the boundary between the first horizontal line 98 and the second horizontal line 99 to have a first bending portion 210. In addition, the second bank layer 176 and the second openings 177 are bent in a second direction opposite to the first direction on the boundary between the second horizontal line 99 and the third horizontal line 103 to have a second bending portion 220. The second bank layer 176 and the second openings 177 may be bent in different directions on the boundaries between a plurality of horizontal lines to have a bending portion, which are not shown.

The aforementioned bending portions of the second bank layer 176 and the second openings 177 serve to partially inhibit the flow of an organic emission material when the organic emission material is dropped and spread. Accordingly, it is possible to prevent the organic light emitting layer from being formed of the organic emission material to different thicknesses in neighboring sub-pixels due to different spreadabilities caused by particles and the like. Therefore, a luminance difference between sub-pixels caused by non-uniform thickness of the organic light emitting layer can be reduced to improve display quality. Further, a current density difference in the organic light emitting layer can be decreased to prevent a decrease in the lifespan of elements and generation of dark spots, improving process yield.

Hereinafter, the cross-sectional structures of the aforementioned sub-pixels in the first horizontal line 98 and the second horizontal line 99 will be described with reference to FIGS. 14 and 15. Although FIGS. 14 and 15 are cross-sectional views taken along lines IV-IV' and V-V' of FIG. 11, the same cutoff lines are shown in FIGS. 12 and 13. The cutoff lines shown in FIGS. 12 and 13 are cutoff lines of the same parts as those shown in FIG. 11 and FIGS. 12 and 13 schematically illustrate FIG. 11.

The structure of the sub-pixels in the first horizontal line 98 is described with reference to FIG. 14. The first sub-pixel 82, the second sub-pixel 84 and the third sub-pixel 86 are defined on the substrate 100. The first sub-pixel 82, the second sub-pixel 84 and the third sub-pixel 86 have the same driving transistor structure and thus the first sub-pixel 82 is described as an example.

The light shielding layer 80 is disposed on the substrate 100 and the buffer layer 105 is disposed on the light shielding layer 80. The semiconductor layer 110 of the driving transistor 35 is disposed on the buffer layer 105 and the gate insulating layer 115 is disposed on the semiconductor layer 110. The gate electrode 120 is positioned on the gate insulating layer 115 and the interlayer insulating layer 125 for insulating the gate electrode 120 is positioned on the gate electrode 120. The source electrode 130 and the drain electrode 135 are positioned on the interlayer insulating layer 125. The source electrode 130 and the drain electrode 135 are connected to the semiconductor layer 110 through the contact holes 137 which expose the source and drain regions of the semiconductor layer 110. Accordingly, the driving transistor 35 including the semiconductor layer 110, the gate electrode 120, the source electrode 130 and the drain electrode 135 is formed.

The first data line 36 and the cathode power line 44 are positioned on one side of the first sub-pixel 82, the sensing line 70 is positioned between the first sub-pixel 82 and the second sub-pixel 84, the second and third data lines 38 and 52 are positioned between the second sub-pixel 84 and the third sub-pixel 86, and the power line 42 is positioned on one side of the third sub-pixel 86.

The passivation layer 140 is positioned on the substrate 100 including the driving transistor 35 and the overcoat layer 150 is disposed on the passivation layer 140. The organic light-emitting diode 60 is formed in each of the sub-pixels 82, 84 and 86 on the overcoat layer 150. The organic light-emitting diode 60 includes the first electrode 160 connected to the driving transistor 35, the second electrode 180 opposite the first electrode 160 and the organic light emitting layer 175 interposed between the first electrode 160 and the second electrode 180.

The bank layer 170 is positioned on the substrate 100 on which the first electrode 160 is formed. The bank layer 170 includes the first bank layer 172 and the second bank layer 176. The first bank layer 172 includes the first opening 173 which exposes the first electrode 160 and the second bank layer 176 includes the second opening 177 which exposes a part of the first bank layer 172 and the first electrode 160. The second opening 177 may be formed to be larger than the first opening 173 to expose a part of the first bank layer 172. The organic light emitting layer 175 is disposed on the substrate 100 on which the bank layer 170 is formed and the second electrode 180 is positioned on the organic light emitting layer 175.

As described above, the first electrodes 160 of the first and second sub-pixels 82 and 84 are shifted to the left and disposed and thus the first electrode 160 of the first sub-pixel 82 and the first opening 173 of the first bank layer 172 are overlapped on the cathode power line 40 disposed thereunder. In addition, the first electrode 160 of the second sub-pixel 84 and the first opening 173 of the first bank layer 172 corresponding to the second sub-pixel 84 are overlapped on the sensing line 70. The second bank layer 176 disposed between the first sub-pixel 82 and the second sub-pixel 84 is overlapped on the driving transistor 35 of the first sub-pixel 82. The first electrode 160 of the third sub-pixel 86 and the first opening 173 of the first bank layer 172 corresponding to the third sub-pixel 86 are overlapped on the third data line 52. The second bank layer 170 disposed between the second sub-pixel 84 and the third sub-pixel 86 is overlapped on the second data line 38.

The structure of the sub-pixels in the second horizontal line 99 is described with reference to FIG. 15. The fourth sub-pixel 92, the fifth sub-pixel 94 and the sixth sub-pixel 96 are defined on the substrate 100. Description of the same structures as those described with respect to FIG. 14 is omitted.

As described above, the first electrodes 160 of the fourth and fifth sub-pixels 92 and 94 are shifted to the right and disposed and thus the first electrode 160 of the fourth sub-pixel 92 and the first opening 173 of the first bank layer 172 are overlapped on the sensing line 70 disposed thereunder. In addition, the first electrode 160 of the fifth sub-pixel 94 and the first opening 173 of the first bank layer 172 corresponding to the fifth sub-pixel 94 are overlapped on the second and third data lines 38 and 52. The second bank layer 176 disposed between the fourth sub-pixel 92 and the fifth sub-pixel 94 is overlapped on the driving transistor 35 of the fifth sub-pixel 94. The second bank layer 170 disposed between the fifth sub-pixel 94 and the sixth sub-pixel 96 is overlapped on the driving transistor 35 of the sixth sub-pixel 96.

The structures of the first electrode, the bank layers, the organic light emitting layer and the second electrode in sub-pixels emitting the same color light in the first to third horizontal lines 98, 99 and 103 are described with reference to FIG. 16. In FIG. 16, structures under the interlayer insulating layer and thin film transistors are omitted and the structures of the power connection line, the first and second gate lines, the first electrode, the bank layers, the organic light emitting layer and the second electrode are described in detail. The omitted structures under the interlayer insulating layer include the semiconductor layer 110, the gate electrode 120, the source electrode 130 and the drain electrode 135 of the driving transistor 35 disposed under the first electrode 160 in FIG. 5. Further, the light shielding layer 80 disposed under the driving transistor 35 and the cathode power line 44 disposed distant from the driving transistor 35 are omitted.

The power connection line 74, the first gate line 32 and the second gate line 34 are arranged to correspond to each of the sub-pixels 82R, 92R and 102R. The passivation layer 140 is disposed on the power connection line 74, the first gate line 32 and the second gate line 34 and the overcoat layer 150 is disposed on the passivation layer 140.

The first electrodes 160 of the sub-pixels 82R, 92R and 102R are disposed on the overcoat layer 150, and the edges of the first electrodes 160 are covered by the first bank layer 172 and thus parts thereof are exposed through the first openings 173. The first openings 173 may be formed in a shape whose one side is rounded, differently from that shown in FIG. 13. However, the present disclosure is not limited thereto and the first openings 173 may be formed in various shapes.

The organic light emitting layer 175 is positioned on the substrate on which the first bank layer 172 is formed. The organic light emitting layer 175 may be formed in the second openings 177 of the second bank layer in a direction in which the second openings 177 extend. That is, an organic emission material dropped on one second opening 177 covers the first electrodes 160 and the first bank layer 172 exposed by the second opening 177. The organic emission material completely covers the first bank layer 172 and thus is not separated by the first bank layer 172.

The first opening 173 formed in each of the sub-pixels 82R, 92R and 102R is exposed by the second opening 177. An organic emission material having a color is dropped on the first electrodes 160 of the sub-pixels 82R, 92R and 102R. This means that a plurality of sub-pixels allocated to regions corresponding to one second opening 177 emit lights having the same color. The plane shape of the organic light emitting layer 175 corresponds to the plane shape of the second opening 177 and may be a bent bar shape, for example.

The first bank layer 172 disposed between the sub-pixels 82R, 92R and 102R is disposed on the power connection line 72 positioned thereunder. In addition, the first opening 173 of each of the sub-pixels 82R, 92R and 102R is overlapped on the first and second gate lines 32 and 34 disposed thereunder.

An organic light-emitting display device according to another aspect of the present disclosure may have different structures of the first and second bank layers for every two horizontal lines.

Referring to FIG. 17, an organic light-emitting display device according to an aspect of the present disclosure includes the substrate 100 on which a plurality of sub-pixels 82, 84, 86, 92, 94, 96, 102, 104, 106, 112, 114 and 116 are arranged. Emission regions of the sub-pixels 82, 84, 86, 92, 94, 96, 102, 104, 106, 112, 114 and 116 are defined by the bank layer 170. In FIG. 17, the bank layer 170 is described in detail and illustration of other components is omitted.

The sub-pixels 82, 84, 86, 92, 94, 96, 102, 104, 106, 112, 114 and 116 may be arranged in a first direction (e.g., X-axis direction) and a second direction (e.g., Y-axis direction) which intersect each other. The first to third sub-pixels 82, 84 and 86 may be arranged in the first horizontal line 98, the fourth to sixth sub-pixels 92, 94 and 96 may be arranged in the second horizontal line 99, the seventh to ninth sub-pixels 102, 104 and 106 may be arranged in the third horizontal line 103, and tenth to twelfth sub-pixels 112, 114 and 116 may be arranged in a fourth horizontal line 109.

The first electrode 160 of the organic light-emitting diode is disposed in each of the sub-pixels 82, 84, 86, 92, 94, 96, 102, 104, 106, 112, 114 and 116. The bank layer 170 disposed on the first electrode 160 to define each emission region. The bank layer 170 includes the first bank layer 172 and the second bank layer 176.

The first bank layer 172 is positioned on the first electrodes 160 and covers the edges of the first electrodes 160. The first bank layer 172 includes the first openings 173 which expose at least parts of the first electrodes 160. One first opening 173 exposes one first electrode 160. Accordingly, the first openings 173 can one-to-one correspond to the first electrodes 160. Parts of the first electrodes 160 exposed by the first openings 173 can be defined as emission regions.

The second bank layer 176 is positioned on the substrate 100 on which the first bank layer 172 is formed. The second bank layer 176 is positioned between sub-pixels emitting lights having different colors among sub-pixels. The second bank layer 176 includes the second openings 177 which expose at least parts of the first electrodes 160.

In the present disclosure, the aforementioned first electrodes 160 are shifted to the left and disposed in the first and second horizontal lines 98 and 99 and shifted to the right and disposed in the third and fourth horizontal lines 103 and 109. The first electrodes 160 of the respective sub-pixels are arranged with such regularity. Accordingly, the first openings 173 of the first bank layer 172 which define the emission regions while covering the edges of the first electrodes 160 can be arranged zigzag according to arrangement of the first electrodes 160.

In addition, since the second bank layer 176 disposed on the first bank layer 172 needs to expose the first openings 173 of the first bank layer 172, the second bank layer 176 and the second openings 177 of the second bank layer 176 can also be arranged zigzag.

Specifically, the second bank layer 176 and the second openings 177 are bent in a first direction on the boundary between the second horizontal line 99 and the third horizontal line 103 to have a first bending portion 210. In addition, the second bank layer 176 and the second openings 177 are bent in a second direction opposite to the first direction under the fourth horizontal line 109, which is not shown. The second bank layer 176 and the second openings 177 may be bent in a different direction on the boundary between two horizontal lines among a plurality of horizontal lines to have abending portion, which are not shown.

The aforementioned bending portions of the second bank layer 176 and the second openings 177 serve to partially inhibit the flow of an organic emission material when the organic emission material is dropped and spread. Accordingly, it is possible to prevent the organic emission material from being formed to different thicknesses in neighboring sub-pixels due to different spreadabilities caused by particles and the like. Therefore, a luminance difference between sub-pixels caused by non-uniform thickness of the organic light emitting layer can be reduced to improve display quality. Further, a current density difference in the organic light emitting layer can be decreased to prevent a decrease in the lifespan of elements and generation of dark spots, improving process yield.

As described above, in the organic light-emitting display device according to an aspect of the present disclosure, the bending portions are formed in the second bank layer to partially inhibit the flow of an organic emission material when the organic emission material is dropped and spread. Accordingly, it is possible to prevent the organic light emitting layer from being formed of the organic emission material to different thicknesses in neighboring sub-pixels due to different spreadabilities caused by particles and the like. Therefore, a luminance difference between sub-pixels caused by non-uniform thickness of the organic light emitting layer can be reduced to improve display quality. Furthermore, a current density difference in the organic light emitting layer can be decreased to prevent a decrease in the lifespan of elements and generation of dark spots, improving process yield.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting display device comprising:
    a substrate;
    a first sub-pixel arranged along a first horizontal line and a second sub-pixel arranged along a second horizontal line on the substrate;
    at least one thin film transistor and a first electrode of an organic light-emitting diode connected to the thin film transistor, the at least one thin film transistor and the first electrode of the organic light-emitting diode being disposed in each of the first sub-pixel and the second sub-pixel;
    at least one line, the at least one line being one of a data line, a sensing line, a power line or a cathode power line intersecting the first horizontal line;
    a first bank layer disposed on the first electrode and defining a respective first opening in each of the first sub-pixel and the second sub-pixel exposing the first electrode of each of the first sub-pixel and the second sub-pixel; and
    a second bank layer disposed on the first bank layer and defining a respective second opening in each of the first sub-pixel and the second sub-pixel exposing the first bank layer of each of the first sub-pixel and the second sub-pixel and the first electrode of each of the first sub-pixel and the second sub-pixel,
    wherein the second bank layer extends perpendicular to the first horizontal line and the second horizontal line and parallel to side ends of the first opening of the first sub-pixel and the first opening of the second sub-pixel,
    wherein the second bank layer is angled in a first direction at a boundary between the respective first opening of the first sub-pixel and the respective first opening of the second sub-pixel,
    wherein the first sub-pixel has a first center line extending in parallel with the at least one line,
    wherein the first electrode of the first sub-pixel has a second center line extending in parallel with the at least one line,
    wherein the second center line of the first electrode of the first sub-pixel is disposed on a first side with respect to the first center line of the first sub-pixel;
    wherein the respective second opening of the second bank layer of the first sub-pixel and the respective second opening of the second bank layer of the second sub-pixel are connected to each other, and
    wherein an organic light emitting layer of the organic light-emitting diode is consecutively arranged in the first sub-pixel and the second sub-pixel, and a position of the organic light emitting layer of the first sub-pixel along the first horizontal line is shifted relative to a position of the organic light emitting layer of the second sub-pixel along the second horizontal line.

2. The organic light-emitting display device of claim 1, further comprising a third sub-pixel arranged along a third horizontal line disposed under the second horizontal line on the substrate.

3. The organic light-emitting display device of claim 2, wherein the second bank layer is angled in a second direction on a boundary between the first opening of the second sub-pixel and a first opening of the third sub-pixel, and
    wherein the first direction is to opposite the second direction.

4. The organic light-emitting display device of claim 2, wherein the first electrode has a third center line in the third sub-pixel disposed on the first side with respect to a fourth center line of the third sub-pixel.

5. The organic light-emitting display device of claim 1, wherein the respective first opening and the respective second opening in each of the first sub-pixel and the second sub-pixel overlap with the at least one line.

6. The organic light-emitting display device of claim 1, wherein the first electrode of the first sub-pixel and the first electrode of the second sub-pixel overlap with the at least one line.

7. The organic light-emitting display device of claim 1, wherein the first electrode has a third center line in the second sub-pixel disposed on a second side opposite to the first side with respect to a fourth center line of the second sub-pixel.

8. The organic light-emitting display device of claim 1, wherein
    the organic light emitting layer is disposed on the first electrode; and
    a second electrode is disposed on the organic light emitting layer.

9. The organic light-emitting display device of claim 1, wherein the first bank layer has hydrophilicity and the second bank layer has hydrophobicity.

10. The organic light-emitting display device of claim 1, wherein a position of the first electrode of the first sub-pixel is shifted relative to a position of the first electrode of the second sub-pixel.

11. The organic light-emitting display device of claim 10, further comprising a third sub-pixel arranged along a third horizontal line disposed under the second horizontal line on the substrate, and
    wherein a first electrode of the third sub-pixel is shifted relative to the position of the first electrode of the second sub-pixel.

12. The organic light-emitting display device of claim 1, wherein the first electrode of the first sub-pixel and the first electrode of the second sub-pixel overlap each other along a vertical direction perpendicular to the first horizontal line and the second horizontal line.

13. An organic light-emitting display device configured on a substrate, comprising:
    a first sub-pixel arranged in a first horizontal line;
    a second sub-pixel arranged in a second horizontal line parallel to the first horizontal line;
    a third sub-pixel arranged in a third horizontal line parallel to the second horizontal line;
    a thin film transistor on the substrate;
    an organic light-emitting diode including a first electrode, a second electrode and an organic light emitting layer, the first electrode being connected to the thin film transistor, the first electrode of the organic light emitting diode being disposed in each of the first sub-pixel, the second sub-pixel, and the third sub-pixel;

at least one line, the at least one line being one of a data line, a sensing line, a power line or a cathode power line intersecting the first horizontal line;

a first bank layer disposed on the first electrode and defining a respective first opening in each of the first sub-pixel and the second sub-pixel exposing the first electrode; and a second bank layer disposed on the first bank layer and defining a respective second opening exposing the first bank layer and the first electrode in each of the first sub-pixel and the second sub-pixel, wherein the second bank layer extends perpendicular to the first horizontal line, the second horizontal line, and the third horizontal line and is parallel to side ends of the respective first opening in the first sub-pixel, the respective first opening in the second sub-pixel, and a respective first opening in the third sub-pixel, wherein the second bank layer is angled in a first direction at a boundary between the respective first opening in the first sub-pixel and the respective first opening in the second sub-pixel, wherein the second bank layer is angled in a second direction at a boundary between the respective first opening in the second sub-pixel and the respective first opening in the third sub-pixel, wherein the first sub-pixel has a first center line extending in parallel with the at least one line, wherein the first electrode of the first sub-pixel has a second center line extending in parallel with the at least one line, wherein the second center line of the first electrode of the first sub-pixel is disposed on a first side with respect to the first center line of the first sub-pixel, wherein the respective second opening of the second bank layer of the first sub-pixel and the respective second opening of the second bank layer of the second sub-pixel are connected to each other, wherein the organic light emitting layer of the organic light-emitting diode is consecutively arranged in the first sub-pixel, the second sub-pixel, and third sub-pixel, wherein a position of the organic light emitting layer of the first sub-pixel along the first horizontal line is shifted relative to a position of the organic light emitting layer of the second sub-pixel along the second horizontal line, and wherein the position of the organic light emitting layer of the first sub-pixel along the second horizontal line is shifted relative to a position of the organic light emitting layer of the third sub-pixel along the third horizontal line.

14. The organic light-emitting display device of claim 13, wherein the first direction is opposite to the second direction.

15. The organic light-emitting display device of claim 13, wherein the first opening and the second opening overlap with the at least one line.

16. The organic light-emitting display device of claim 13, wherein the first electrode of the first sub-pixel and the first electrode of the second sub-pixel overlap with the at least one line.

17. The organic light-emitting display device of claim 13, wherein the first electrode has a third center line in the second sub-pixel disposed on a second side opposite to the first side with respect to a first center line of the second sub-pixel.

18. The organic light-emitting display device of claim 13, wherein the first electrode has a third center line in the third sub-pixel disposed on the first side with respect to a fourth center line of the third sub-pixel.

* * * * *